(12) United States Patent
Zhu et al.

(10) Patent No.: US 8,624,315 B2
(45) Date of Patent: Jan. 7, 2014

(54) FIELD EFFECT TRANSISTOR HAVING AN ASYMMETRIC GATE ELECTRODE

(75) Inventors: Huilong Zhu, Poughkeepsie, NY (US); Qingqing Liang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/344,955

(22) Filed: Jan. 6, 2012

(65) Prior Publication Data

US 2012/0104513 A1 May 3, 2012

Related U.S. Application Data

(62) Division of application No. 11/830,316, filed on Jul. 30, 2007, now Pat. No. 8,110,465.

(51) Int. Cl.
*H01L 29/788* (2006.01)

(52) U.S. Cl.
USPC .... 257/315; 257/410; 257/412; 257/E29.255; 257/E21.209; 257/E21.422; 438/151; 438/157; 438/176; 438/195; 438/197; 438/267; 438/283; 438/286; 438/299; 365/185.01

(58) Field of Classification Search
USPC .......... 257/315, 410, 412, E29.255, E21.409, 257/E21.209, E21.422, E29.306; 438/151, 438/157, 176, 195, 197, 267, 283, 286, 438/299; 365/185.01
See application file for complete search history.

(56) References Cited

U.S. PATENT DOCUMENTS

| | | | |
|---|---|---|---|
| 4,270,137 A | 5/1981 | Coe | |
| 4,714,519 A | 12/1987 | Pfiester | |
| 4,745,079 A | 5/1988 | Pfiester | |
| 5,031,008 A | 7/1991 | Yoshida | |
| 5,091,763 A | 2/1992 | Sanchez | |
| 5,407,844 A | 4/1995 | Smayling et al. | |
| 5,753,952 A | 5/1998 | Mehrad | |
| 5,894,157 A | 4/1999 | Han et al. | |
| 5,977,591 A | 11/1999 | Fratin et al. | |
| 6,015,993 A | 1/2000 | Voldman et al. | |
| 6,096,641 A | 8/2000 | Kunikiyo | |
| 6,121,666 A | 9/2000 | Burr | |
| 6,124,170 A | 9/2000 | Lim et al. | |
| 6,187,657 B1 | 2/2001 | Xiang et al. | |
| 6,211,555 B1 | 4/2001 | Randazzo et al. | |
| 6,232,163 B1 | 5/2001 | Voldman et al. | |
| 6,306,738 B1 | 10/2001 | Selcuk | |
| 6,429,482 B1 | 8/2002 | Culp et al. | |
| 6,531,734 B1 | 3/2003 | Wu | |

(Continued)

*Primary Examiner* — Meiya Li
(74) *Attorney, Agent, or Firm* — Scully, Scott, Murphy & Presser, P.C.; H. Daniel Schnurmann

(57) ABSTRACT

The gate electrode of a metal oxide semiconductor field effect transistor (MOSFET) comprises a source side gate electrode and a drain side gate electrode that abut each other near the middle of the channel. In one embodiment, the source side gate electrode comprises a silicon oxide based gate dielectric and the drain side gate electrode comprises a high-k gate dielectric. The source side gate electrode provides high carrier mobility, while the drain side gate electrode provides good short channel effect and reduced gate leakage. In another embodiment, the source gate electrode and drain gate electrode comprises different high-k gate dielectric stacks and different gate conductor materials, wherein the source side gate electrode has a first work function a quarter band gap away from a band gap edge and the drain side gate electrode has a second work function near the band gap edge.

12 Claims, 24 Drawing Sheets

(56) References Cited

U.S. PATENT DOCUMENTS

| | | |
|---|---|---|
| 6,642,579 B2 | 11/2003 | Fung |
| 6,759,721 B2 | 7/2004 | Skotnicki et al. |
| 6,768,149 B1 | 7/2004 | Mann et al. |
| 6,803,276 B2 | 10/2004 | Kim et al. |
| 6,878,579 B2 | 4/2005 | Ohuchi et al. |
| 7,170,137 B2 | 1/2007 | Yasutake et al. |
| 7,288,788 B2 | 10/2007 | Ellis-Monaghan et al. |
| 7,391,084 B2 | 6/2008 | Arnborg et al. |
| 7,563,682 B2 | 7/2009 | Arnborg et al. |
| 7,612,392 B2 | 11/2009 | Jung et al. |
| 7,785,973 B2 | 8/2010 | Baptiste |
| 2001/0017390 A1 | 8/2001 | Long et al. |
| 2002/0109153 A1 | 8/2002 | Ker et al. |
| 2002/0190287 A1 | 12/2002 | Mann et al. |
| 2002/0197810 A1 | 12/2002 | Hanafi et al. |
| 2005/0035410 A1 | 2/2005 | Yeo et al. |
| 2005/0141281 A1 | 6/2005 | Jung |
| 2006/0118835 A1 | 6/2006 | Ellis-Monaghan et al. |
| 2006/0180868 A1 | 8/2006 | Maciejewski et al. |
| 2006/0186460 A1* | 8/2006 | Choi et al. ............. 257/315 |
| 2007/0029587 A1 | 2/2007 | Greer et al. |
| 2007/0075337 A1 | 4/2007 | Jung et al. |
| 2007/0218633 A1* | 9/2007 | Prinz et al. ............. 438/267 |
| 2007/0252212 A1 | 11/2007 | Onsongo et al. |
| 2008/0128767 A1 | 6/2008 | Adkisson et al. |

* cited by examiner

FIELD EFFECT TRANSISTOR HAVING AN ASYMMETRIC GATE ELECTRODE

CROSS REFERENCE TO RELATED APPLICATION

This application is a divisional of U.S. patent application Ser. No. 11/830,316, filed Jul. 30, 2007 the entire content and disclosure of which is incorporated herein by reference.

FIELD OF THE INVENTION

The present invention relates to semiconductor devices, and particularly, to a metal oxide semiconductor field effect transistor (MOSFET) having an asymmetric gate electrode and methods of manufacturing the same.

BACKGROUND OF THE INVENTION

High gate leakage current of nitrided silicon dioxide and depletion effect of polysilicon gate electrodes limit the performance of conventional silicon oxide based gate electrodes in metal oxide semiconductor field effect transistors (MOSFETs). High performance devices for an equivalent oxide thickness (EOT) less than 1 nm require high dielectric constant (high-k) gate dielectrics and metal gate electrodes to limit the gate leakage current and provide high on-currents. The high-k gate dielectrics have demonstrated improvement in short channel effects in transistors having a gate length less than 65 nm compared with conventional silicon oxide based gate dielectrics.

A high-k dielectric material needs to provide good electrical stability, that is, the amount of charge trapped in the high-k dielectric material needs to remain at a low level even after extended operation of a transistor. The high-k dielectric material needs to be scalable, that is, provide an acceptable level of leakage and an acceptable level of electron and hole mobility at a reduced thickness, e.g., less than 1 nm. While the mechanisms for degradation of mobility associated with thin high-k dielectric materials are not fully understood, it is generally believed that trapped charge scattering and/or phonon scattering are primary causes.

In view of the above, there exists a need for a MOSFET structure providing advantageous properties of conventional gate dielectrics and high-k gate dielectrics and methods of manufacturing the same.

Particularly, there exists a need for a MOSFFET structure having limited gate leakage as provided by high-k gate dielectrics and free of degradation of mobility that is typically associated with thin high-k gate dielectrics, and methods of manufacturing the same.

Further, modulation of work function of the gate electrode along a channel between a source and drain of a MOSFET may enhance device performance by increasing the on-current of the MOSFET. Specifically, a gate electrode of an n-type MOSFET may employ a first material having a first work function at a value less than the middle of the band gap of the channel material near the source, and a second material having a second work function at a value greater than the middle of the band gap of the channel material near the drain. Likewise, a gate electrode of a p-type MOSFET may employ a third material having a third work function at a value greater than the middle of the band gap of the channel material near the source, and a fourth material having a fourth work function at a value greater than the middle of the band gap of the channel material near the drain.

Therefore, there exists a need for a MOSFET structure having a graded work function across a channel and methods of manufacturing the same.

Specifically, there exists a need for a MOSFET structure having a gate electrode containing a first material and a second material, wherein the first material has a work function at a value closer to a conduction band edge of a channel material than a valence band of the same, and wherein the second material has a work function at a value closer to a valence band edge of a channel material than a conduction band edge of the same, and methods of manufacturing the same.

SUMMARY OF THE INVENTION

The present invention addresses the needs described above by providing metal oxide semiconductor field effect transistors (MOSFETs) having an asymmetric gate electrode and methods of manufacturing the same.

The gate electrode of a metal oxide semiconductor field effect transistor (MOSFET) comprises a source side gate electrode and a drain side gate electrode that abut each other near the middle of the channel. In one embodiment, the source side gate electrode comprises a silicon oxide based gate dielectric and the drain side gate electrode comprises a high-k gate dielectric. The source side gate electrode provides high carrier mobility, while the drain side gate electrode provides good short channel effect and reduced gate leakage. In another embodiment, the source gate electrode and drain gate electrode comprises different high-k gate dielectric stacks and different gate conductor materials, wherein the source side gate electrode has a first work function about a quarter band gap away from a band gap edge and the drain side gate electrode has a second work function near the band gap edge.

According to an aspect of the present invention, a semiconductor structure is provided, which comprises:

a body comprising a semiconductor material, having a doping of a first conductivity type, and located in a semiconductor substrate;

a source region having a doping of a second conductivity type, abutting the body, and located in the semiconductor substrate, wherein the second conductivity type is the opposite of the first conductivity type;

a drain region having a doping of the second conductivity type, abutting the body, disjoined from the source region, and located in the semiconductor substrate;

a source side gate electrode containing a first gate dielectric and a first gate conductor, wherein the first gate dielectric vertically abuts the body, and wherein the first gate conductor abuts the first gate dielectric; and a drain side gate electrode abutting the source side gate electrode and containing a second gate dielectric and a second gate conductor, wherein the second gate dielectric vertically abuts the body, and wherein the second gate conductor abuts the second gate dielectric.

In one embodiment, the first gate dielectric comprises a silicon oxide based dielectric material and the second gate dielectric comprises a high-k dielectric material.

In another embodiment, the second gate dielectric is L-shaped, and wherein the first gate conductor is disjoined from the second gate conductor by the second gate dielectric.

In even another embodiment, the first gate conductor and the second gate conductor comprises the same semiconductor material.

In yet another embodiment, the first gate conductor comprises a semiconductor material and the second gate conductor comprises a second semiconductor material, wherein the second semiconductor material is different from the semiconductor material.

In still another embodiment, the semiconductor structure further comprises a metal semiconductor alloy abutting the first gate conductor and the second gate conductor.

In still yet another embodiment, the semiconductor material comprises silicon, and wherein the first gate dielectric comprises silicon oxide or nitridated silicon oxide, and wherein the second gate dielectric is one of $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof, and each of the first gate conductor and the second gate conductor comprises at least one of doped polysilicon, Ti, TaN, TaSiN, $CoSi_2$, Ni, WN, W, Re, and NiSi.

In a further embodiment, the semiconductor structure further comprises:
a gate spacer comprising a dielectric material and laterally abutting the first gate conductor and the second gate conductor and vertically abutting the first gate dielectric and the second gate dielectric;
a source metal semiconductor alloy laterally abutting the first gate dielectric; and
a drain metal semiconductor alloy laterally abutting the second gate dielectric.

According to another aspect of the present invention, another semiconductor structure is provided, which comprises:
a body comprising a semiconductor material, having a doping of a first conductivity type, and located in a semiconductor substrate;
a source region having a doping of a second conductivity type, abutting the body, and located in the semiconductor substrate, wherein the second conductivity type is the opposite of the first conductivity type;
a drain region having a doping of the second conductivity type, abutting the body, disjoined from the source region, and located in the semiconductor substrate;
a source side gate electrode containing a first gate dielectric portion and a first gate conductor, wherein the first gate dielectric portion vertically abuts the body, and wherein the first gate conductor abuts the first gate dielectric; and
a drain side gate electrode abutting the source side gate electrode and containing a second gate dielectric portion and a second gate conductor, wherein the second gate dielectric portion vertically abuts the body.

In one embodiment, the first gate dielectric portion comprises a high-k dielectric material and the second gate dielectric portion comprises the high-k dielectric material and has a same thickness as the first gate dielectric portion.

In another embodiment, the first gate conductor has a first work function from 0.0% to about 49.9% of a band gap of the semiconductor material away from a band gap edge of the semiconductor material toward another band gap edge of the semiconductor material, and wherein the second gate conductor has a second work function from about 50.1% to 100.0% of the band gap of the semiconductor material away from the band gap edge of the semiconductor material toward the another band gap edge of the semiconductor material.

In even another embodiment, the first conductivity type is p-type and the second conductivity type is n-type, and wherein the band gap edge is a conduction band edge and the another band gap edge is a valence band edge.

In yet another embodiment, the first conductivity type is n-type and the second conductivity type is p-type, and wherein the band gap edge is a valence band edge and the another band gap edge is a conduction band edge.

In still another embodiment, the first gate conductor comprises a stack of a metal gate layer and a semiconductor gate layer.

In a further embodiment, the semiconductor material comprises silicon, wherein the first high-k dielectric material is one of $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof, and wherein the metal gate layer comprises at least one of n-doped polysilicon, Ti, TaN, TaSiN, and $CoSi_2$, and wherein the semiconductor gate layer comprises doped polysilicon or doped polysilicon alloy, and wherein the second gate conductor comprises at least one of p-doped polysilicon, Ni, WN, W, Re, and NiSi.

In further another embodiment, the semiconductor material comprises silicon, wherein the first high-k dielectric material is one of $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof, and wherein the metal gate layer comprises at least one of p-doped polysilicon, Ni, WN, W, Re, and NiSi, and wherein the semiconductor gate layer comprises doped polysilicon or doped polysilicon alloy, and wherein the second gate conductor comprises at least one of n-doped polysilicon, Ti, TaN, TaSiN, and $CoSi_2$.

In a still further embodiment, the first high-k dielectric material has the same thickness in the source side gate electrode and in the drain side gate electrode.

According to yet another aspect of the present invention, a method of manufacturing a semiconductor structure is provided, which comprises:
forming a gate dielectric on a semiconductor substrate comprising a semiconductor material;
forming a first gate conductor layer on the gate dielectric;
forming a spacer template layer on the first gate conductor layer;
patterning the spacer template layer to form a sidewall;
forming a dielectric spacer directly on the sidewall and on the first gate conductor layer;
etching the first gate conductor layer employing the dielectric spacer as an etch template;
forming a second gate conductor laterally abutting a portion of the first gate conductor layer; and
etching the first gate conductor layer employing the dielectric spacer as an etch mask to form a first gate conductor, wherein the first gate conductor laterally abuts the second gate conductor.

In one embodiment, the method further comprises:
forming a dielectric gate spacer laterally abutting the first gate conductor and the second gate conductor; and
forming a source region and drain region abutting the dielectric gate spacer in the semiconductor substrate.

In another embodiment, the first gate conductor comprises a stack of a metal gate layer containing a first metal gate material and a semiconductor layer containing a semiconductor material, and wherein the second gate conductor comprise a second metal gate material.

In even another embodiment, the semiconductor material comprises silicon, wherein the gate dielectric comprises one of $HfO_2$, $ZrO_2$, $La_2O_3$, $TiO_2$, $Ta2O_5$, $SrTiO_3$, $Y_2O_3$, $Al_2O_3$, LaAlO3, an alloy thereof, and a silicate thereof, and wherein the semiconductor gate layer comprises doped polysilicon or doped polysilicon alloy, wherein one of the first metal gate material and the second metal gate material comprises at least one of n-doped polysilicon, Ti, TaN, TaSiN, and $CoSi_2$, and wherein the other of the first metal gate material and the second metal gate material comprises at least one of p-doped polysilicon, Ni, WN, W, Re, and NiSi.

In yet another embodiment, the method further comprises:
exposing a portion of the semiconductor substrate after the etching of the first gate conductor layer; and
forming another gate dielectric on the exposed portion prior to the forming of the second gate conductor, wherein the another gate dielectric is L-shaped and separates the second gate conductor from the first gate conductor.

In still another embodiment, the semiconductor material comprises silicon, and wherein the gate dielectric is silicon oxide or nitridated silicon oxide, and wherein the another gate dielectric comprises one of $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof, and each of the first gate conductor and the second gate conductor comprises at least one of doped polysilicon, Ti, TaN, TaSiN, $CoSi_2$, Ni, WN, W, Re, and NiSi.

DETAILED DESCRIPTION OF THE INVENTION

Figure 1:
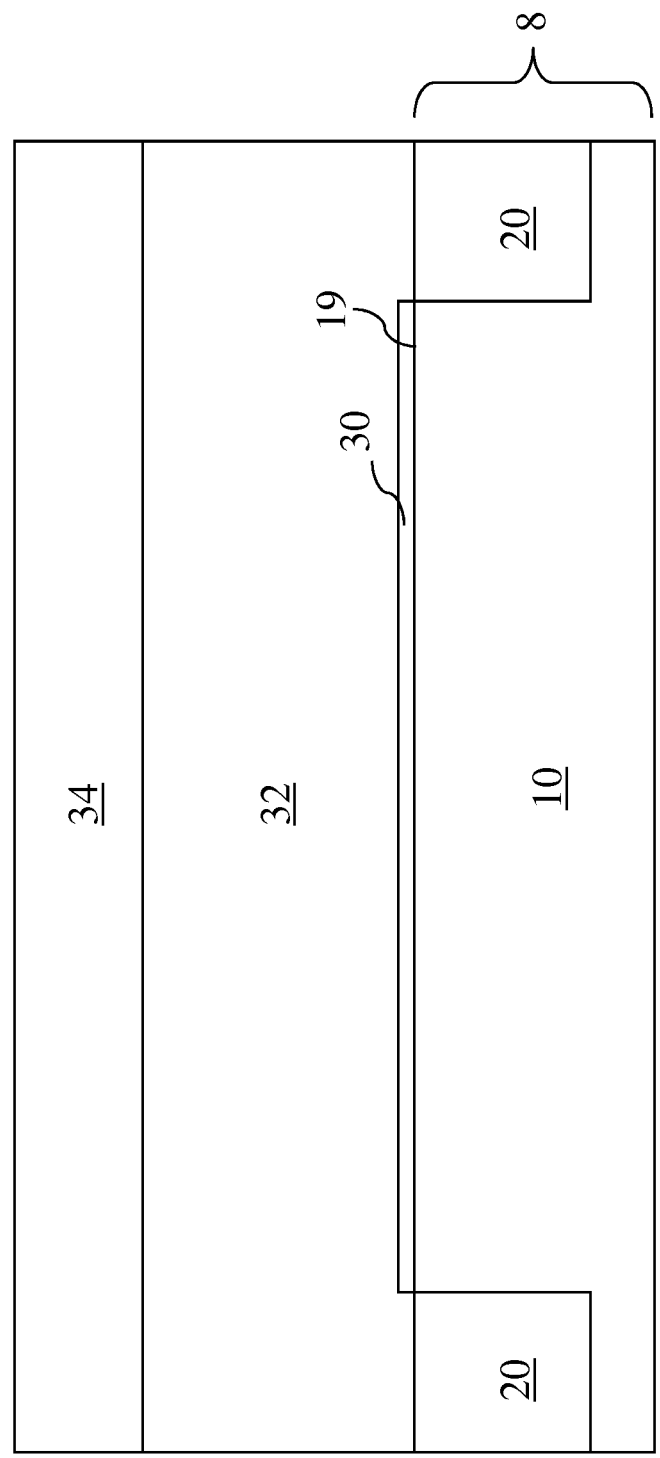
FIGS. 1-14 are sequential vertical cross-sectional views of a first exemplary structure according to a first embodiment of the present invention.

As stated above, the present invention relates to a metal oxide semiconductor field effect transistor (MOSFET) having an asymmetric gate electrode and methods of manufacturing the same, which are now described in detail with accompanying figures. It is noted that like and corresponding elements are referred to by like reference numerals.

Referring to FIG. 1, a first exemplary semiconductor structure according to a first embodiment of the present invention comprises a semiconductor substrate 8 containing shallow trench isolation 20 and a substrate layer 10. The shallow trench isolation 20 comprises a dielectric material such as silicon oxide. The shallow trench isolation 20 surrounds a region of the substrate layer 10 so that a device formed in the region may be electrically isolated from other devices located on the same semiconductor substrate 8.

The substrate layer 10 comprises a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary embodiment, the semiconductor material comprises silicon. The substrate layer 10 is preferably single crystalline. The substrate layer 10 may be doped with electrical dopants of a first conductivity type. The electrical dopants may be at least one of p-type dopants such as B, Ga, and In. Alternately, the electrical dopants may be at least one of n-type dopants such as P, As, and Sb. The concentration of the electrical dopants may be from about $1.0 \times 10^{15}$ atoms/cm$^3$ to about $1.0 \times 10^{19}$ atoms/cm$^3$. Non-electrical stress-generating dopants such as Ge and/or C may also be present.

The substrate layer 10 may have a built-in biaxial stress in the plane perpendicular to the direction of the surface normal of a top surface 19 of the semiconductor substrate 8. While the present invention is described with a bulk semiconductor substrate, the present invention may be implemented on a semiconductor-on-insulator substrate or on a hybrid substrate. Such variations are explicitly contemplated herein.

A first gate dielectric 30 comprising a silicon oxide based material is formed on the top surface 19 of the semiconductor substrate 8. Preferably, the first gate dielectric 30 comprises a silicon oxide based dielectric material such as silicon oxide, nitridated silicon oxide, silicon oxynitride, or a stack thereof.

Alternately, the first gate dielectric 30 may comprise a high-k dielectric material, i.e., a dielectric metal oxide or a silicate thereof having a dielectric constant that is greater than the dielectric constant of silicon oxide of 3.9. For example, the high-k dielectric material may comprise one of $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof. The high-k dielectric material may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc.

The thickness of the first gate dielectric 30 may be from about 1 nm to about 3 nm in the case of a conventional dielectric material, and from about 2 nm to about 6 nm in the case of the high-k dielectric material, and may have an effective oxide thickness on the order of or less than 1 nm.

A first gate conductor layer 32 is formed on the first gate dielectric 30, for example, by chemical vapor deposition (CVD). The first gate conductor layer 32 may comprise a semiconductor material such as doped polysilicon or doped silicon containing alloy, or may comprise a metal such as Ti, TaN, TaSiN, $CoSi_2$, Ni, WN, W, Re, and NiSi. In one embodiment, the first gate conductor layer 32 comprises a material having a work function closer to the valence band of silicon than to the conduction band of silicon such as n-doped polysilicon, Ti, TaN, TaSiN, and $CoSi_2$. In another embodiment, the first gate conductor layer 32 comprises a material having a work function closer to the conduction band of silicon than to the valence band of silicon such as p-doped polysilicon, WN, W, Re, and NiSi. The thickness of the first gate conductor layer 32 may be from about 30 nm to about 150 nm, and typically from about 60 nm to about 120 nm, although lesser and greater thickness are herein contemplated as well.

A spacer template layer 34 is formed on the first gate conductor layer 32. The spacer template layer 34 may comprise a dielectric material, a semiconductor material, or a metal. The spacer template layer 34 comprises a different material than the first conductor layer 32 so that a portion of the spacer template layer 34 may be employed as an etch mask during a subsequent etch of the first conductor layer 32. In one embodiment, the spacer template layer 34 comprises a polycrystalline silicon germanium alloy having an atomic concentration of germanium from about 2% to about 40%, and preferably from about 5% to about 20%. The thickness of the spacer template layer 34 may be from about 20 nm to about 200 nm, and preferably from about 40 nm to about 100 nm.

Figure 2:
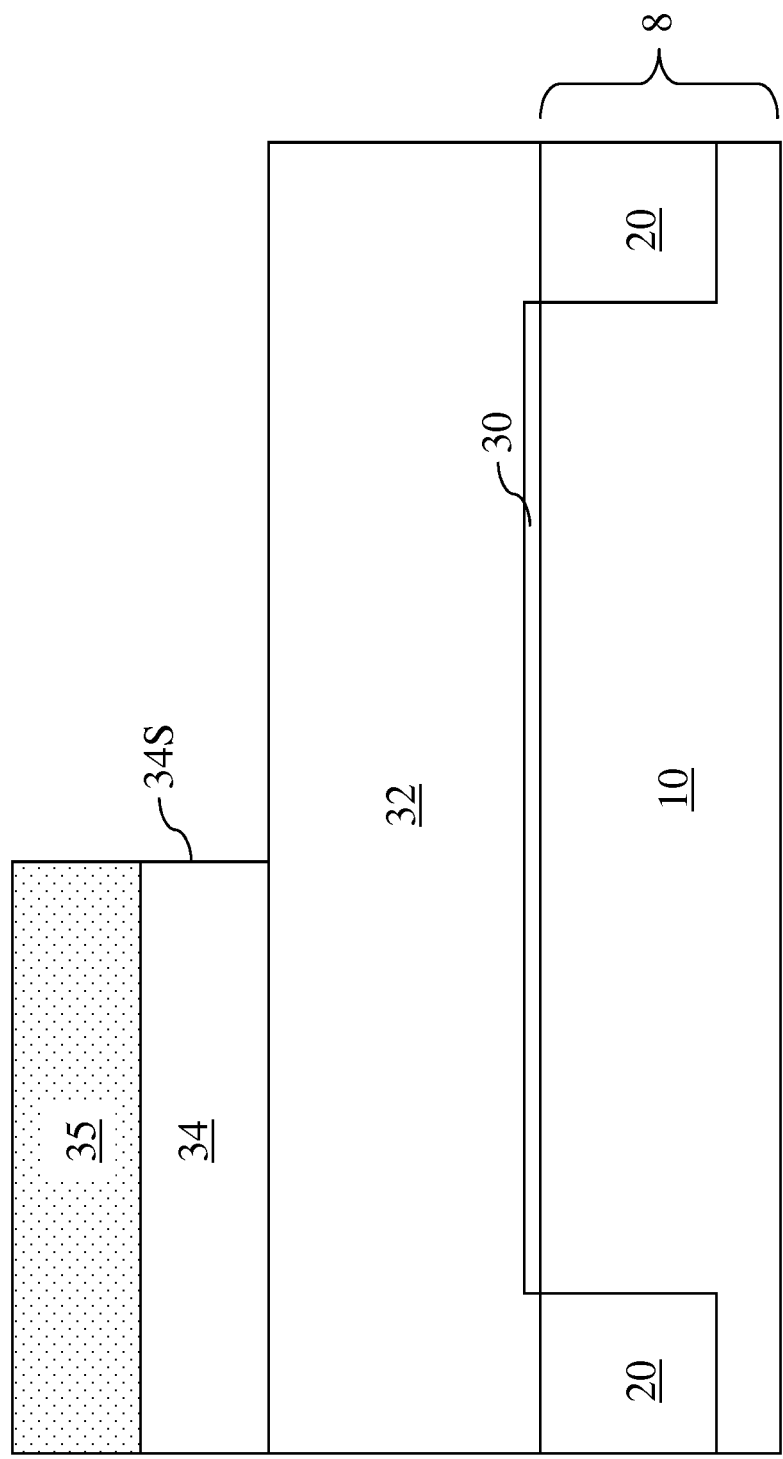

Referring to FIG. 2, a photoresist 35 is applied to a top surface of the spacer template layer 34 and lithographically patterned. The pattern in the photoresist 35 is transferred into the spacer template layer 34 by a reactive ion etch and forms a sidewall 34S that is substantially vertical and extends from a top surface of the spacer template layer 34 to a bottom surface of the spacer template layer 34.

Figure 3:
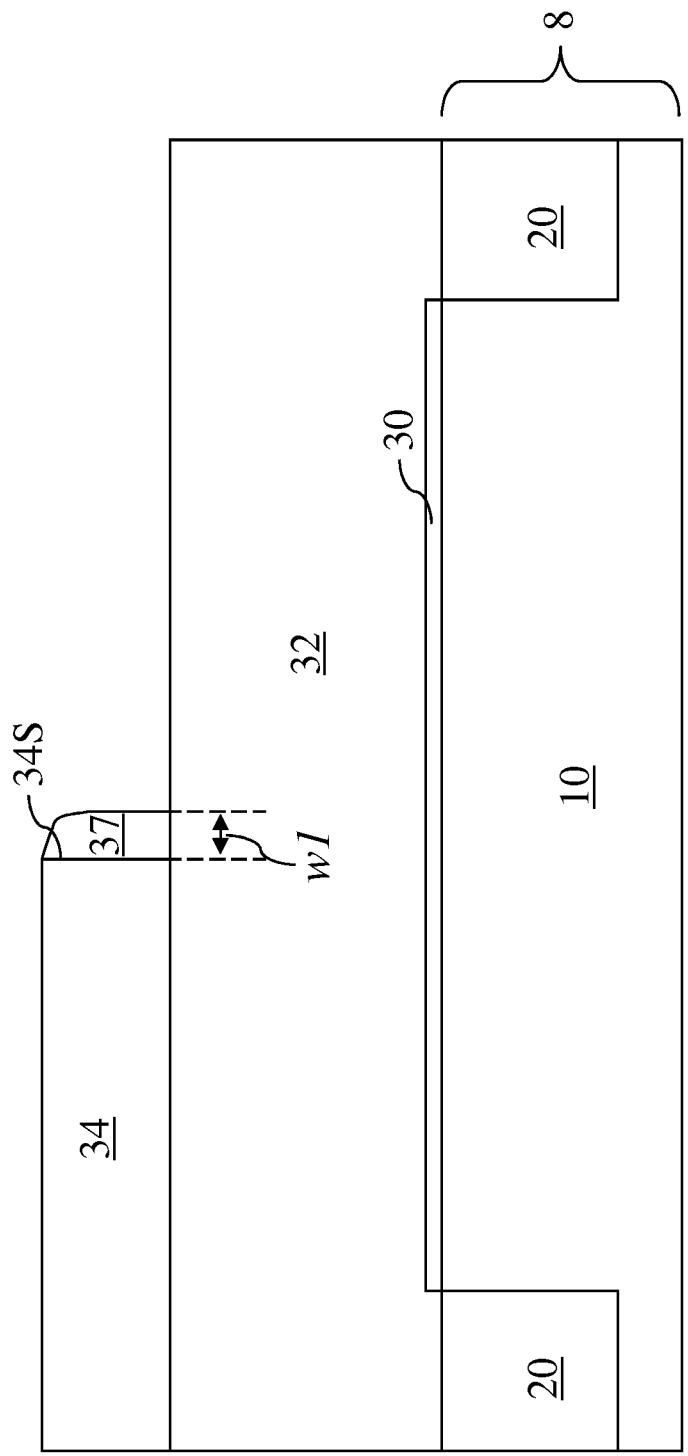

Referring to FIG. 3, a first dielectric spacer 37 is formed by conformal deposition of a first dielectric layer (not shown) and an anisotropic reactive ion etch. Horizontal portions of the first dielectric layer are removed by the anisotropic reactive ion etch, and the first dielectric spacer 37 is formed directly on the sidewall 34S of the spacer template layer 34. The pattern on the spacer template layer 34 guides the shape of the first dielectric spacer 37. The sidewall 34S of the spacer template layer 34 coincides with one edge of a gate electrode to be subsequently formed.

The first dielectric spacer 37 comprises a dielectric material such as silicon nitride, silicon oxide, or a stack thereof. In one embodiment, the first dielectric spacer 37 comprises silicon nitride. The first dielectric spacer 37 may, or may not, comprise the same material as the shallow trench isolation 20. Preferably, the first dielectric spacer 37 comprises a different dielectric material from the dielectric material of the shallow trench isolation 20. The first width w1 of the first dielectric spacer 37, or the lateral thickness of the first dielectric spacer 37 at its base, is substantially determined by the thickness of the dielectric layer. The first width w1 of the first dielectric spacer 37 is less than the gate length of the gate electrode to be subsequently formed. The first width w1 may be from about 5 nm to about 50 nm, although lesser and greater dimensions are also contemplated herein.

Figure 4:
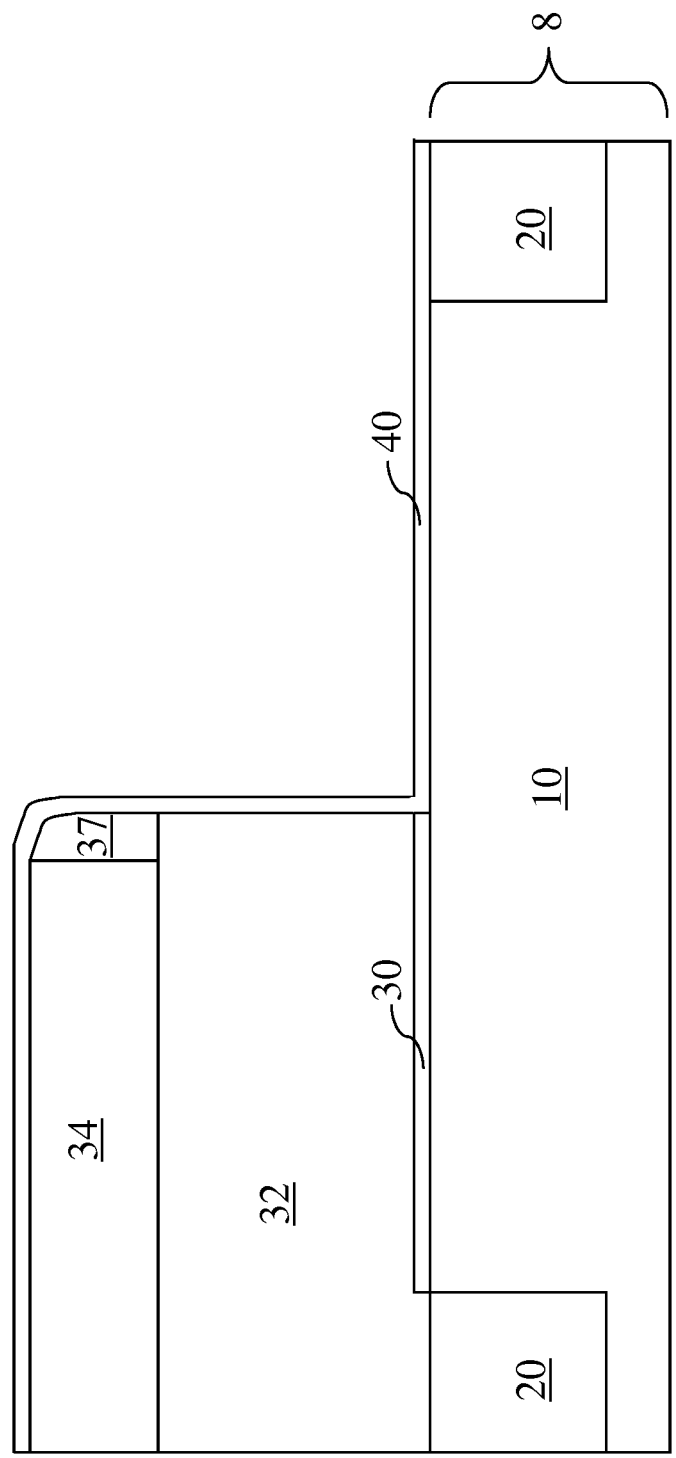

Referring to FIG. 4, exposed portions of the first gate conductor layer is removed by a reactive ion etch that employs the first dielectric spacer 37 as an etch mask. In one embodiment, the spacer template layer 34 may also be employed as the etch mask, i.e., the dielectric layer 37 and the spacer template layer are collectively employed as the etch mask. In another embodiment, at least a portion of the spacer template layer 34 may be removed by the reactive ion etch. Different levels of removal of the spacer template layer 34 including a complete removal are contemplated herein.

The reactive ion etch may stop on the first gate dielectric 30, or alternatively, etch the first gate dielectric and stop on the substrate layer 10.

A second gate dielectric 40 is deposited on the exposed portions of the substrate layer 10, a sidewall of the first gate dielectric 30, a sidewall of the first gate conductor layer 32, the first dielectric spacer 47, and exposed surfaces of the spacer template layer 34, if applicable.

Preferably, the second gate dielectric 40 comprises a high-k dielectric material such as $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof. The high-k dielectric material may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc.

Alternately, the second gate dielectric 40, may comprise a conventional dielectric material such as silicon oxide, silicon nitride, silicon oxynitride, and/or a stack thereof. The conventional dielectric material may be formed by thermal conversion of a top portion of the substrate layer 10 and/or by chemical vapor deposition (CVD).

The thickness of the second gate dielectric 40 may be from about 1 nm to about 3 nm in the case of a conventional dielectric material, and from about 2 nm to about 6 nm in the case of the high-k dielectric material, and may have an effective oxide thickness on the order of or less than 1 nm.

The first gate dielectric 30 and the second gate dielectric 40 may have the same effective oxide thickness (EOT), or different effective oxide thicknesses. The first gate dielectric 30 and the second gate dielectric 40 may comprise the same material, or different materials. Preferably, the second gate dielectric 40 comprises a different material than the first gate dielectric 30. More preferably, the first gate dielectric 30 comprises a silicon oxide based dielectric material, while the second gate dielectric 40 comprises a high-k dielectric material.

Figure 5:
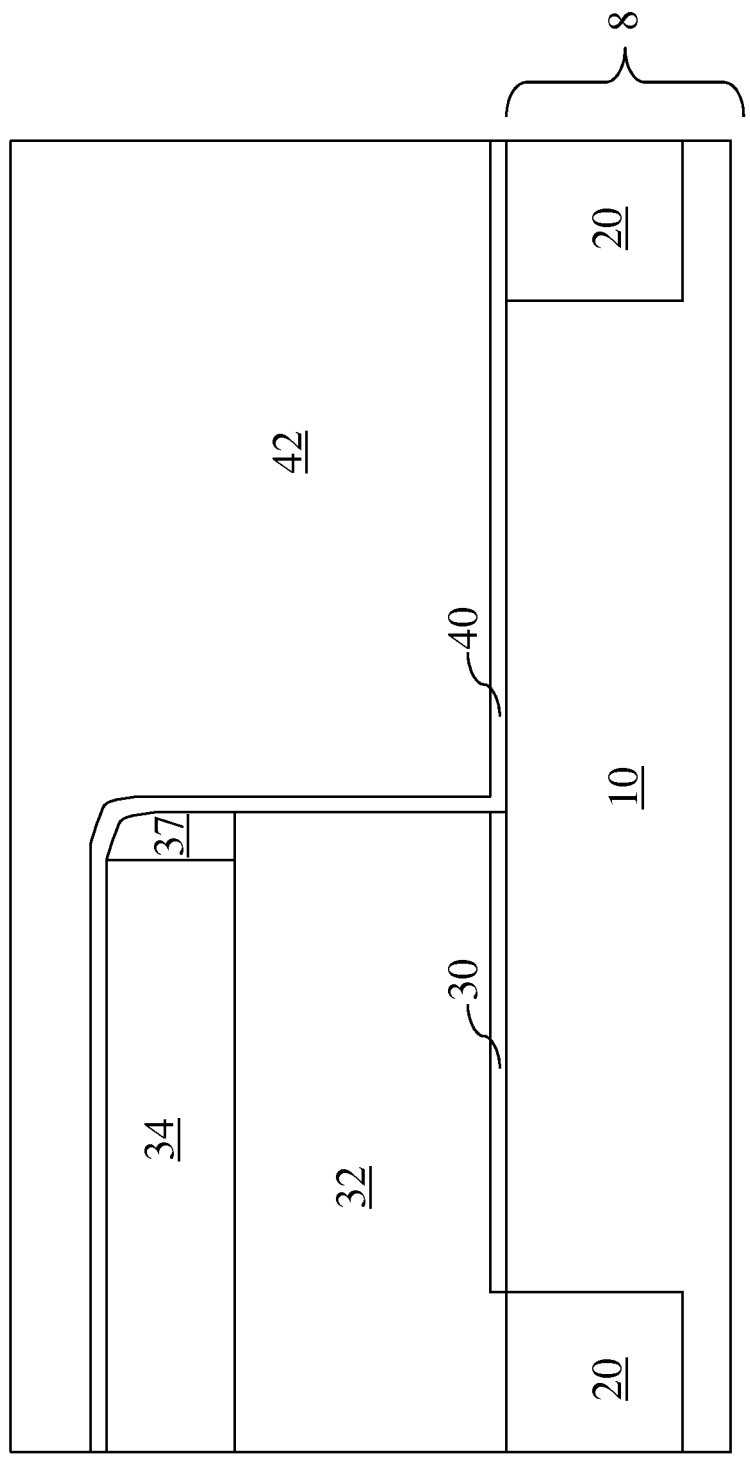

Referring to FIG. 5, a second gate conductor layer 42 is deposited and planarized. For example, chemical vapor deposition (CVD) may be employed for the deposition process and chemical mechanical polishing (CMP), recess reactive ion etch, or a combination thereof may be employed for the planarization process.

The second gate conductor layer 42 may comprise a semiconductor material such as doped polysilicon or doped silicon containing alloy, or may comprise a metal such as Ti, TaN, TaSiN, $CoSi_2$, Ni, WN, W, Re, and NiSi. Preferably, the second gate conductor layer 42 comprises a different material from the first gate conductor layer 32.

In one embodiment, the substrate layer 10 comprises silicon and the first gate conductor layer 32 comprises a material having a work function closer to the valence band of silicon than to the conduction band of silicon such as n-doped polysilicon, Ti, TaN, TaSiN, and $CoSi_2$, while the second gate conductor layer 42 comprises a material having a work function closer to the conduction band of silicon than to the valence band of silicon such as p-doped polysilicon, WN, W, Re, and NiSi. In this case, the field effect transistor to be formed is preferably an n-type transistor having a p-type body and n-type source and drain regions.

In another embodiment, the substrate layer 10 comprises silicon and the first gate conductor layer 32 comprises a material having a work function closer to the conduction band of silicon than to the valence band of silicon such as p-doped polysilicon, WN, W, Re, and NiSi, while the second gate conductor layer 42 comprises a material having a work function closer to the valence band of silicon than to the conduction band of silicon such as n-doped polysilicon, Ti, TaN, TaSiN, and $CoSi_2$. In this case, the field effect transistor to be formed is preferably a p-type transistor having an n-type body and p-type source and drain regions.

The thickness of the second gate conductor layer 42 is preferably greater than the sum of the thickness of the first gate conductor layer 32 and the thickness of the spacer template layer 34, and may be from about 50 nm to about 500 nm, and typically from about 100 nm to about 250 nm, although lesser and greater thickness are herein contemplated as well. An embodiment in which the second gate conductor layer 42 comprises the same material from the first gate conductor layer 32 is herein contemplated also.

Figure 6:
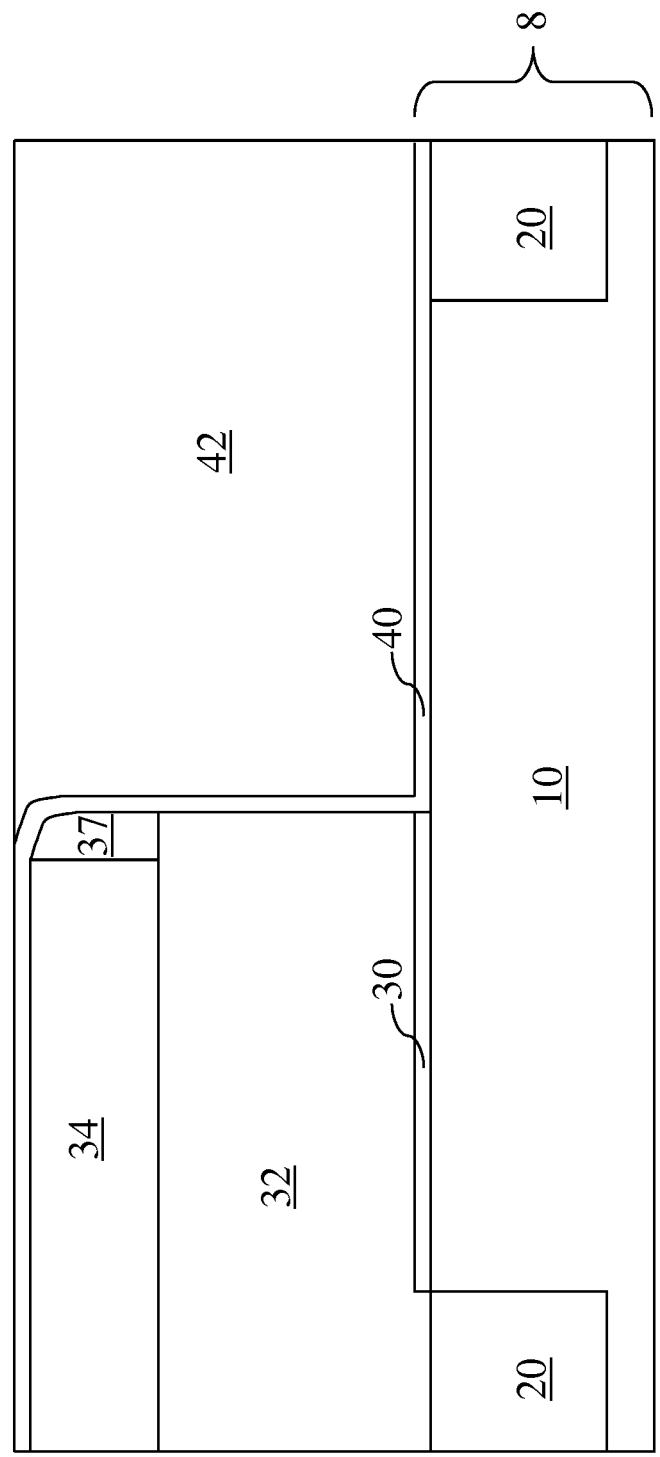

Referring to FIG. 6, the second gate conductor layer 42 is further removed to the level of the second gate dielectric 40 above the spacer template layer 34. The second gate dielectric 40 may be employed as a stopping layer during planarization of the second gate dielectric layer 42. Alternately, the second gate dielectric 40 may be employed as an endpoint layer to signal exposure of the second gate dielectric 40 during the reactive ion etch of the second gate conductor layer 42.

Figure 7:
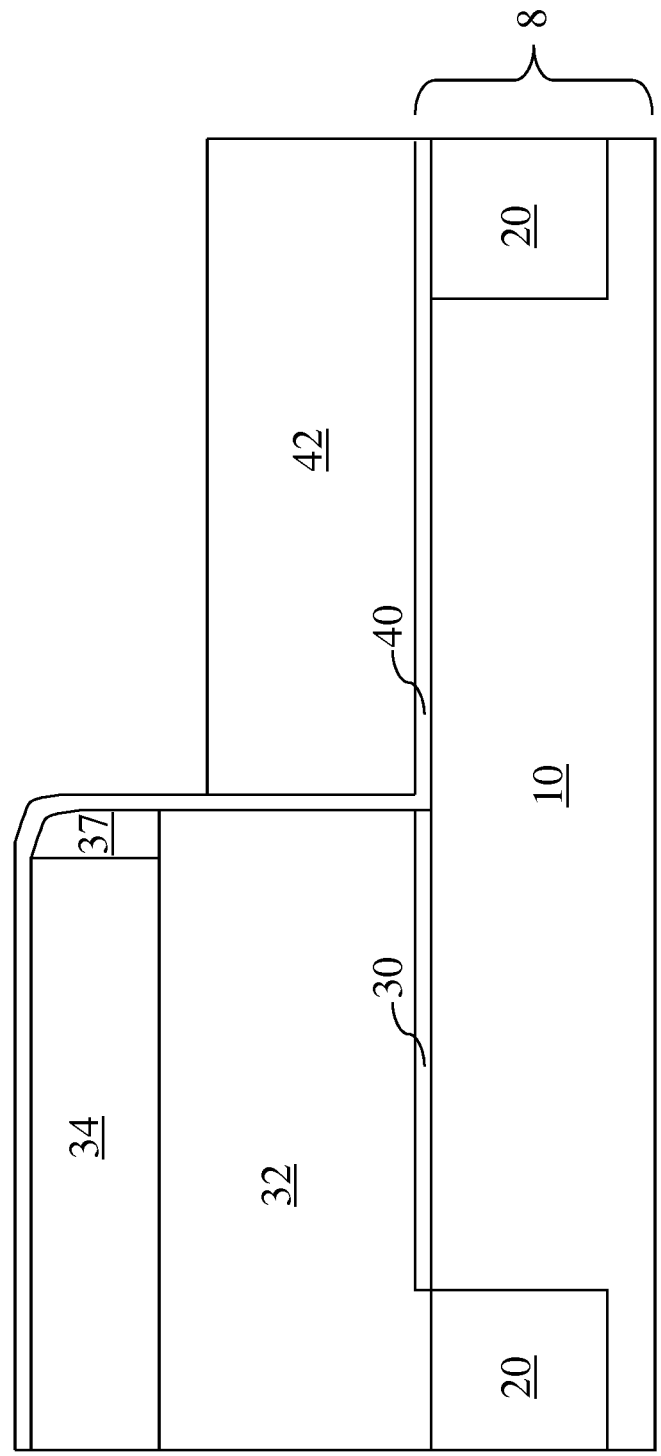

Referring to FIG. 7, the second gate conductor layer 42 is further recessed below the level of the top surface of the spacer template layer 34, for example, by a reactive ion etch. The thickness of the second gate conductor layer 42 after the reactive ion etch may be from about 20 nm to about 130 nm, and typically from about 45 nm to about 100 nm, although lesser and greater thickness are herein contemplated as well. The thickness of the second gate conductor layer 42 at this point may be substantially the same as, or less than, the thickness of the first gate conductor layer 32.

Figure 8:
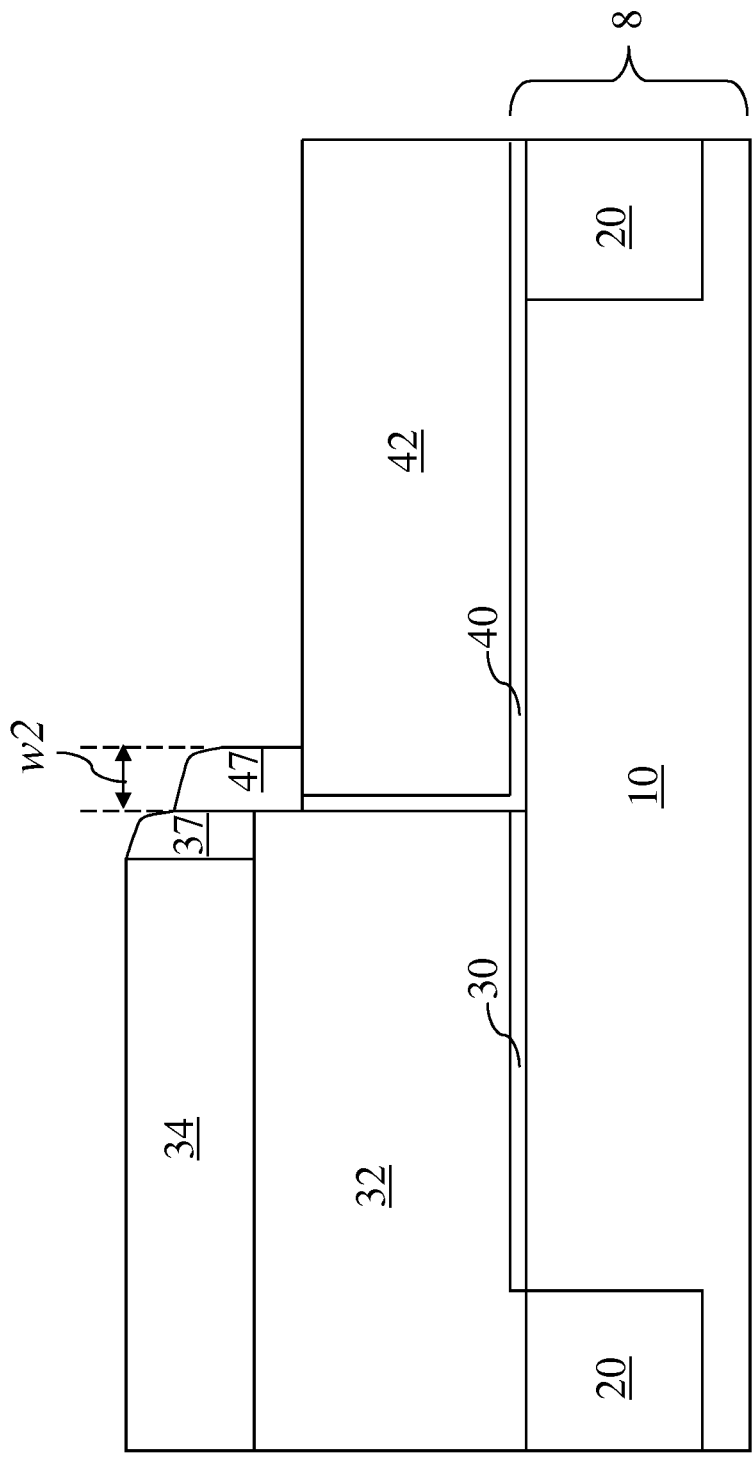

Referring to FIG. 8, exposed portions of the second gate dielectric 40 is removed by a substantially isotropic etch. The remaining portion of the second gate dielectric is L-shaped, i.e., has a vertical cross-sectional profile in the shape of the letter "L." The substantially isotropic etch may be a substantially isotropic reactive ion etch or a wet etch. Preferably, the substantially isotropic etch is selective to the first dielectric spacer 37, i.e., does not etch the first dielectric spacer 37 in any substantial manner.

A second dielectric spacer 38 is formed by conformal deposition of a second dielectric layer (not shown) and an anisotropic reactive ion etch. Horizontal portions of the second dielectric layer are removed by the anisotropic reactive ion etch, and the second dielectric spacer 47 is formed directly on the first dielectric spacer 37. The shape of the first dielectric spacer 37 guides the shape of the second dielectric spacer 47, since the second dielectric spacer 47 adjoins the first dielectric spacer 37. The outer sidewall of the second dielectric spacer 47, i.e., the sidewall of the second dielectric spacer 47 that does not abut the first dielectric spacer 37, coincides with the other edge the gate electrode to be subsequently formed.

The second dielectric spacer 47 comprises another dielectric material such as silicon nitride, silicon oxide, or a stack thereof. In one embodiment, the second dielectric spacer 47 comprises silicon nitride. The second dielectric spacer 47 may comprise the same material as the first dielectric spacer 37, or may comprise a different material than the first dielectric spacer 37. The second dielectric spacer 47 may, or may not, comprise the same material as the shallow trench isolation 20. Preferably, the second dielectric spacer 47 comprises a different dielectric material from the dielectric material of the shallow trench isolation 20. The second width $w2$ of the second dielectric spacer 47, or the lateral thickness of the second dielectric spacer 47 at its base, is substantially determined by the thickness of the second dielectric layer. The second width $w2$ of the second dielectric spacer 47 is less than the gate length of the gate electrode to be subsequently formed. As will be shown below, the sum of the first width $w1$ and the second width $w2$ is substantially the same as the gate length of the gate electrode to be subsequently formed. The second width $w2$ may be from about 5 nm to about 50 nm, although lesser and greater dimensions are also contemplated herein.

Figure 9:
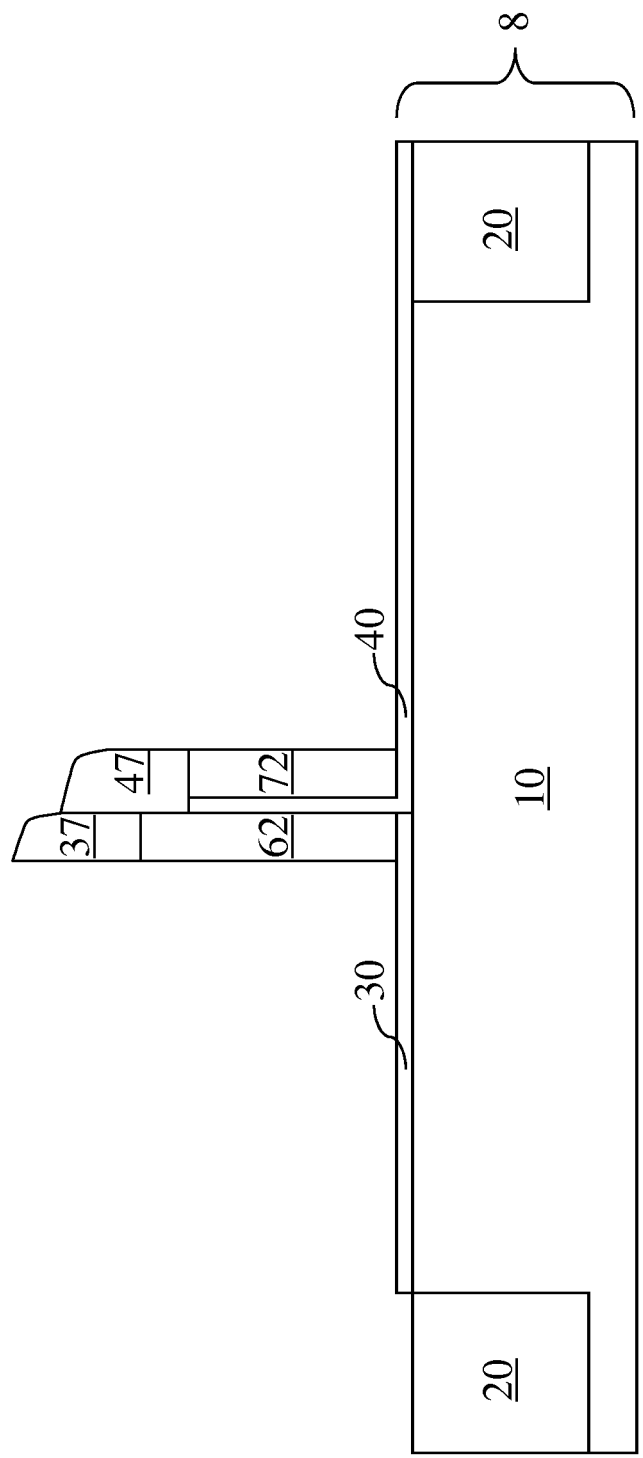

Referring to FIG. 9, any remaining portion of the spacer template layer 34 is removed by a wet etch or a reactive ion etch. Employing the first dielectric spacer 37 and the second dielectric spacer 47 collectively as an etch mask, the exposed portions of the first gate conductor layer 32 and the second gate conductor 42 are etched at least down to a top surface of the first gate dielectric 30 or a top surface of the second gate dielectric 40. The remaining portion of the first gate conductor layer 32 constitutes a first gate conductor 62, while the remaining portion of the second gate conductor layer 42 constitutes a second gate conductor 72. The first gate conductor 62 may have a greater height than the second gate conductor 72. One of the first gate conductor 62 and the second gate conductor 72 may be recessed selective to the other to alter relative heights of the first gate conductor 62 and the second gate conductor 72. In this case, the first gate conductor 62 may have a greater height than, a lesser height than, or substantially the same height as the second gate conductor 72.

Figure 10:
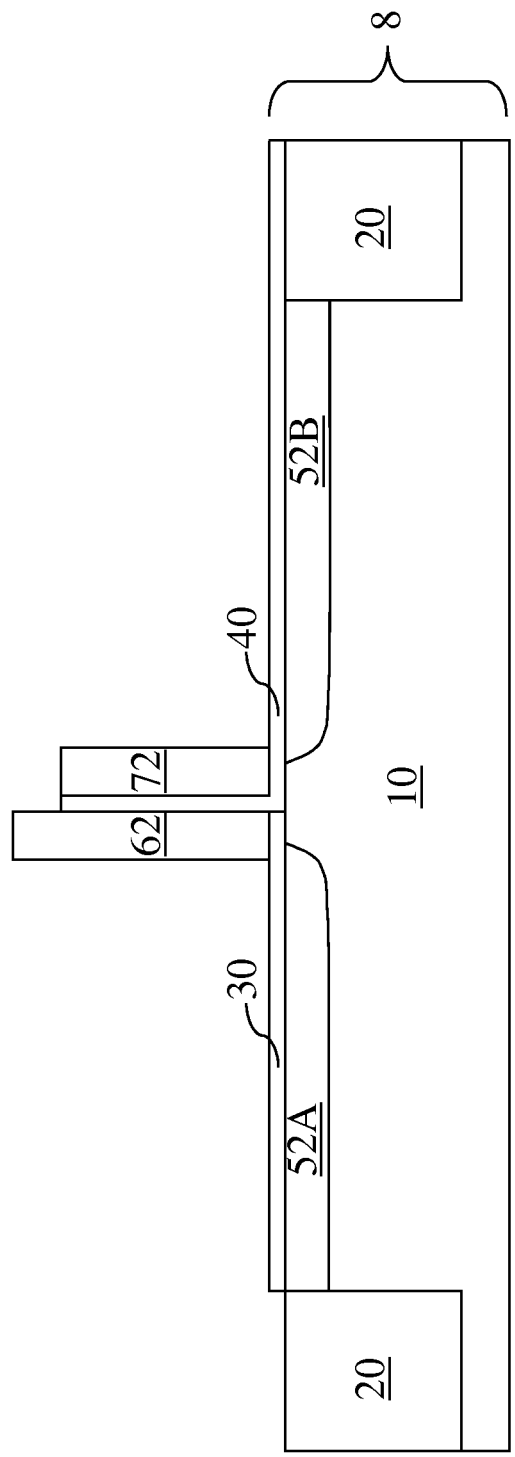

Referring to FIG. 10, the first dielectric spacer 37 and the second dielectric spacer 47 are removed, for example, by a wet etch or a reactive ion etch. Preferably, the removal of the first dielectric spacer 37 and the second dielectric spacer 47 is selective to the shallow trench isolation 20, i.e., the removed amount of the shallow trench isolation 20 is insignificant. Source extension region 52A and drain extension region 52B having a doping of a second conductivity type may be formed by implantation of dopants of the second conductivity type, which is the opposite of the first conductivity type. If the first conductivity type is p-type, the second conductivity type is n-type, and vice versa.

Halo implantation may be performed to form source side halo region (not shown) and drain side halo region (not shown) directly beneath the source extension region 52A and the drain extension region 52B, respectively. The halo implantation implants dopants of the first conductivity type, i.e., dopants of the same conductivity type as the doping of the substrate layer 10.

Figure 11:
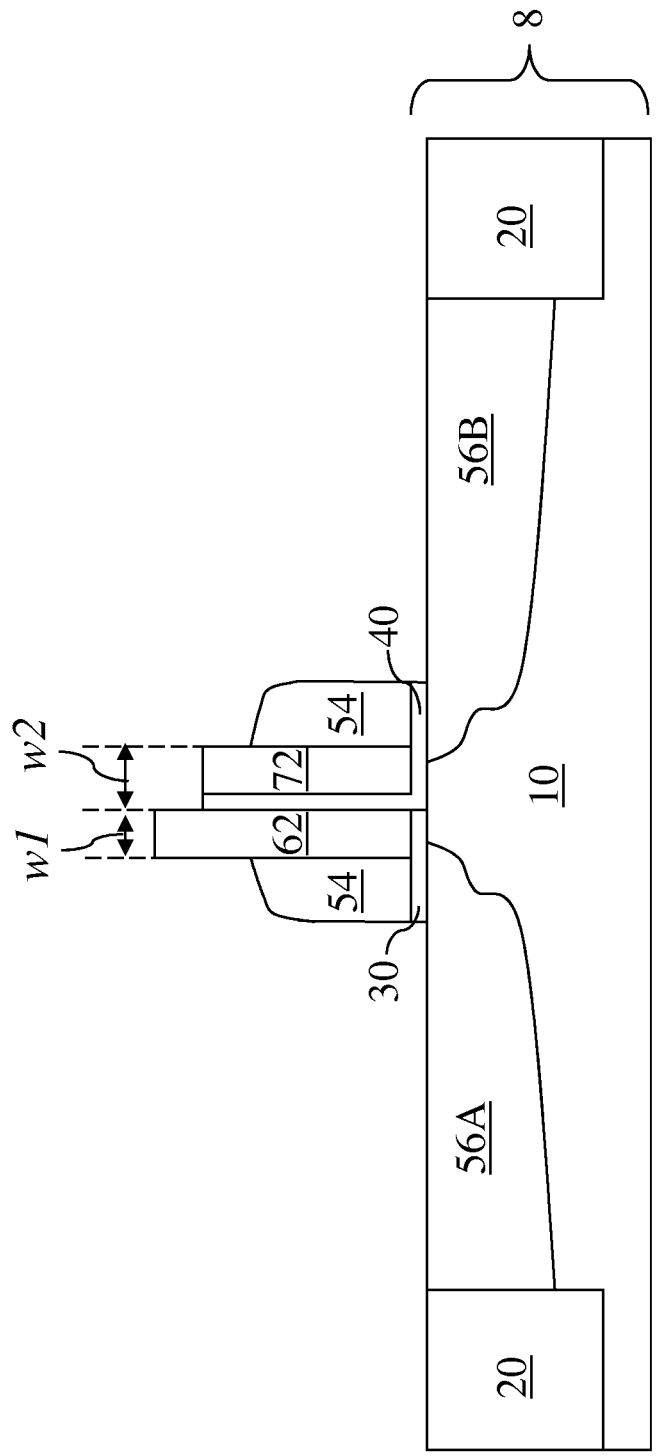

Referring to FIG. 11, a gate spacer 54 is formed directly on an outer sidewall of the first gate conductor 62 and on an outer sidewall of the second gate conductor 72. The gate spacer 54 comprises a dielectric material such as silicon oxide or silicon nitride. The gate spacer 54 may be formed by a conformal deposition of a gate spacer layer (not shown) followed by an anisotropic reactive ion etch. The width, or the lateral dimension, of the gate spacer 54, as measured from one of the outer sidewalls of the first gate conductor 62 and the second gate conductor 72 to a nearest outer sidewall of the gate spacer 54, may be from about 5 nm to about 120 nm, and typically from about 20 nm to abut 80 nm.

Source and drain implantation is performed into the substrate layer 10 to form a source region 56A and the drain region 56B having a doping of the second conductivity type. The source region 56A herein denotes a contiguous region having the second conductivity type doping that abuts the first gate dielectric 30. The source region 56A includes the source extension region 52A. Likewise, the drain region 56B herein denotes a contiguous region having the second conductivity type doping that abuts the second gate dielectric 40. The drain region 56B includes the drain extension region 52B.

The exposed portions of the first gate dielectric 30 and the second gate dielectric 40 are removed thereafter, for example, by a reactive ion etch, a wet etch, or a combination thereof. The remaining portion of the second gate dielectric 40 has an L-shape having substantially the same height as the second gate conductor 72 and laterally extending from a sidewall of the first gate conductor 62 to an outer edge of the gate spacer 54 located above the drain region 56B.

While the present invention is described with the first gate dielectric 30 and the second gate dielectric 40 located above the source extension region 52A and the drain extension region 52B during the various ion implantation steps, the present invention may be practiced with the with exposed portions of the first gate dielectric 30 and the second gate dielectric 40 removed, i.e., with the surface of the substrate layer exposed outside the area of the first gate conductor 62 and the second gate conductor 72, during at least one of the implantation steps.

The sum of the first width $w1$ and the second width $w2$ is substantially the same as the gate length of the gate electrode, which comprises the first gate conductor 62 and the second gate conductor 72.

Figure 12:
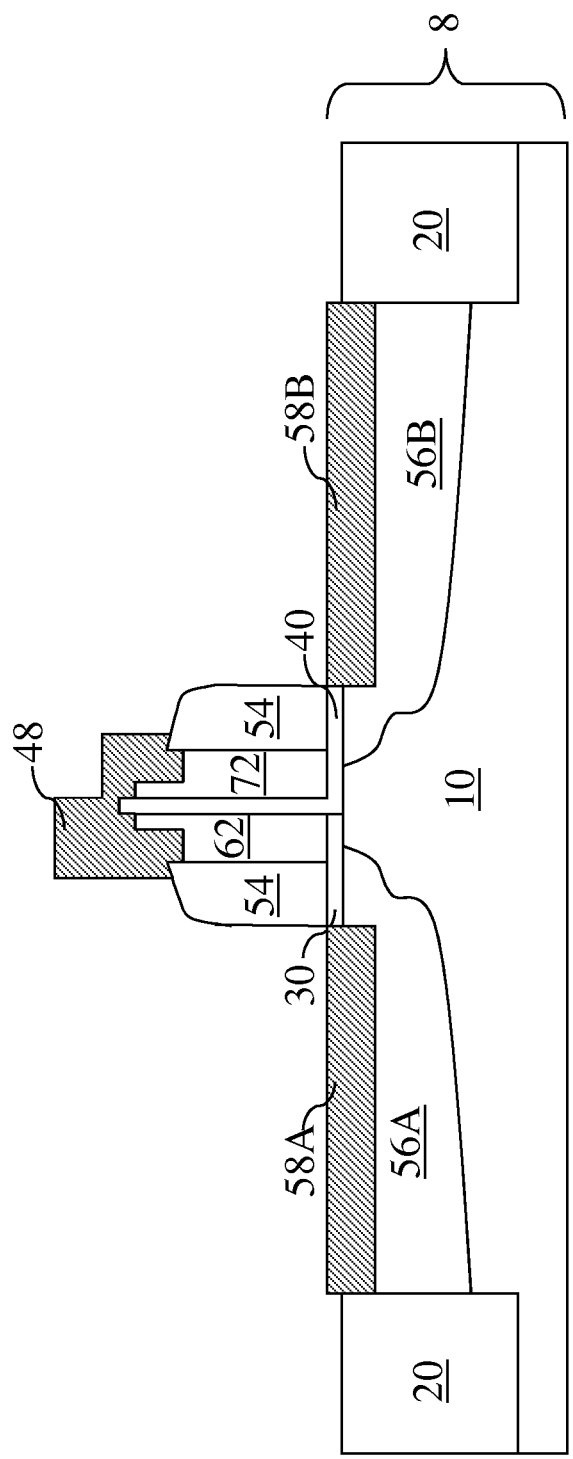

Referring to FIG. 12, metallization is performed on exposed portions of the semiconductor material to form various metal semiconductor alloys. Specifically, a source metal semiconductor alloy 58A is formed on the source region 56A, and a drain metal semiconductor alloy 58B is formed on the drain region 26B. In case the substrate layer 10 comprises silicon, the source metal semiconductor alloy 58A and the drain metal semiconductor alloy 58B comprise a metal silicide. Methods of forming a metal semiconductor alloy is well known in the art, and typically involves deposition of a metal layer, an anneal at an elevated temperature to facilitate metallization, and removal of unreacted portion of the metal layer.

In one embodiment, at least one of the first gate conductor 62 and the second gate conductor 72 comprises a semiconductor material such as doped polysilicon or a doped polycrystalline silicon alloy. The metal layer reacts with the semiconductor material of at least one of the first gate conductor 62 and the second gate conductor 72 to form a gate metal semiconductor alloy 48. Typically, the gate metal semiconductor alloy 48 is derived from the same metal layer and formed at the same processing steps as the source metal semiconductor alloy 58A and the drain metal semiconductor alloy 58B. In case only one of the first gate conductor 62 and the second gate conductor 72 reacts with the metal layer to form the gate metal semiconductor alloy 48, the gate metal semiconductor alloy 48 may, or may not, contact the other of the first gate conductor 62 and the second gate conductor 72 that does not form a metal semiconductor alloy.

In another embodiment, none of the first gate conductor 62 and the second gate conductor 72 comprises a semiconductor material. For example, each of the first gate conductor 62 and the second gate conductor 72 may comprise a metal. In this case, a gate metal semiconductor alloy is not formed.

Figure 13:
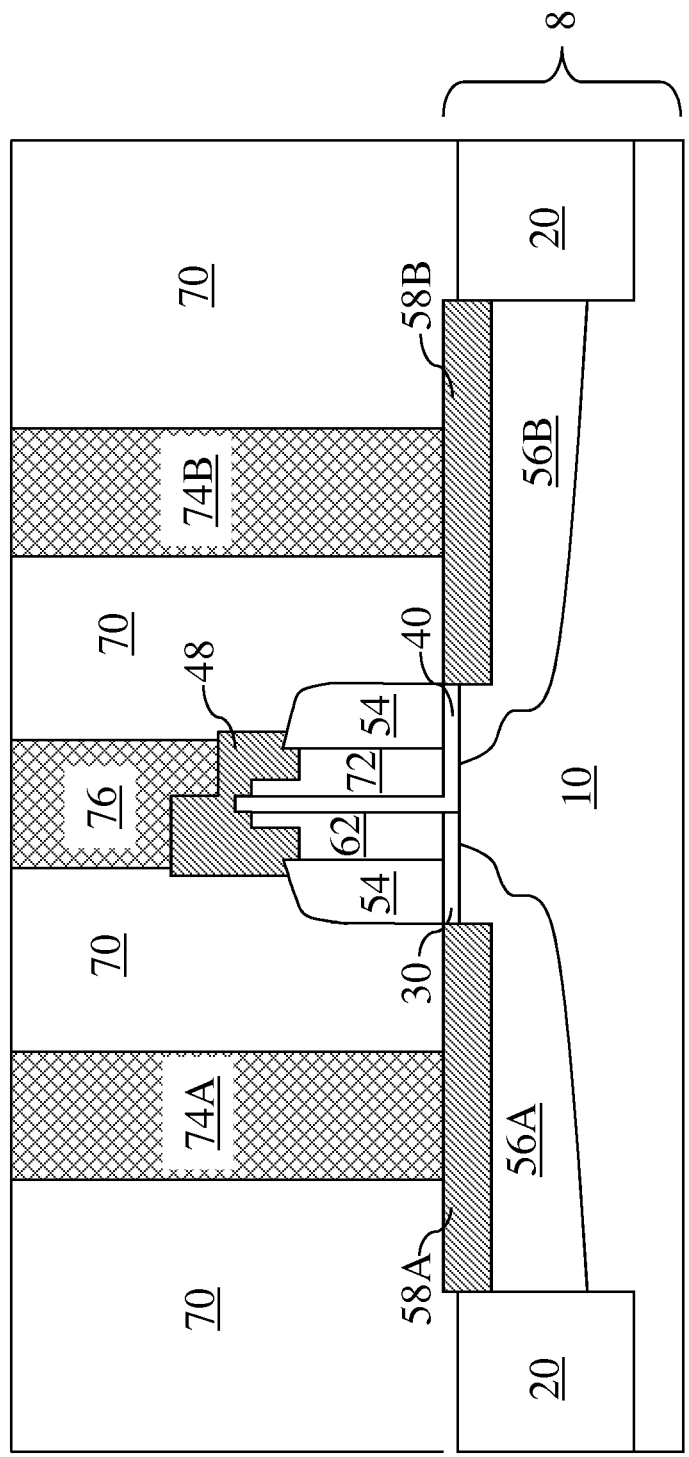

Referring to FIG. 13, a middle-of-line (MOL) dielectric layer 70 is formed on the gate spacer 54, the source metal semiconductor alloy 58A, the drain metal semiconductor alloy 58B, and the shallow trench isolation 20, and the gate metal semiconductor alloy 48 if present. The MOL dielectric layer 70 may comprise a silicon oxide, a silicon nitride, a chemical vapor deposition (CVD) low-k dielectric material, a spin-on low-k dielectric material, or a stack thereof. The MOL dielectric layer 70 may contain a mobile ion diffusion barrier layer that prevents diffusion of mobile ions such as sodium and potassium from back-end-of-line (BEOL) dielectric layers. Further, the MOL dielectric layer 70 may contain a stress liner that applies tensile or compressive stress on underlying structures to alter charge carrier mobility in a portion of the substrate layer 10 such as a channel of a transistor.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

Contact via holes are formed in the MOL dielectric layer 70 and filled with metal to form various metal contacts. Specifically, a source contact via 74A is formed directly on the source metal semiconductor alloy 58A, and a drain contact via 74B is formed directly on the drain metal semiconductor alloy 58B. A gate contact via 76 is formed directly on the gate metal semiconductor alloy 48.

The substrate layer 10, which now excludes the source region 56A and the drain region 56B, maintains the initial doping of the first conductivity type, and serves as a body of a field effect transistor.

The first exemplary semiconductor structure comprises:
a source side gate electrode containing a first gate dielectric 30 and a first gate conductor 62, wherein the first gate dielectric 30 vertically abuts the body and comprises a silicon oxide based dielectric material, and wherein the first gate conductor 30 abuts the first gate dielectric; and
a drain side gate electrode abutting the source side gate electrode (30, 62) and containing a second gate dielectric 40 and a second gate conductor 72, wherein the second gate dielectric 40 vertically abuts the body and comprises a high-k dielectric material, and wherein the second gate conductor 72 abuts the second gate dielectric 40.

Figure 14:
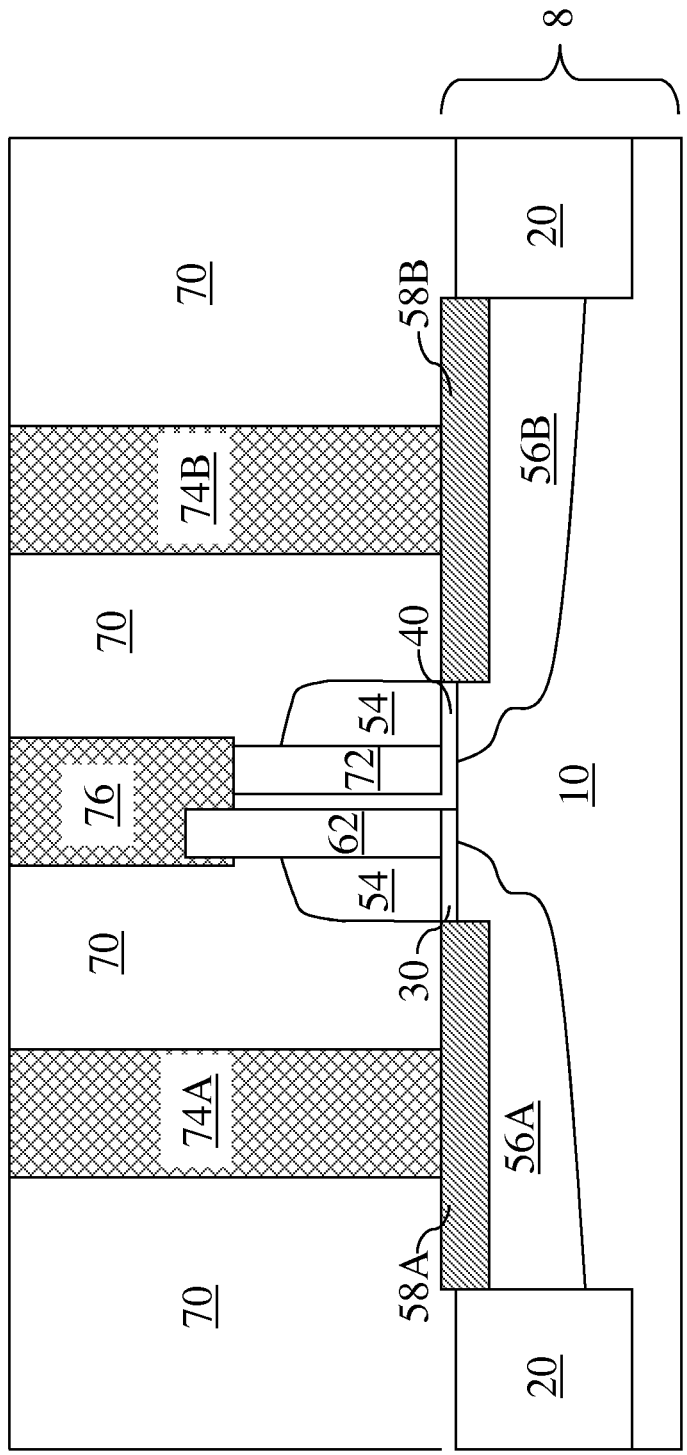

Referring to FIG. 14, a variation on the first exemplary semiconductor structure is shown in which a gate metal semiconductor alloy is not formed. In this case, the gate contact via 76 directly contacts the first gate conductor 62 and the second gate conductor 72.

Figure 15:
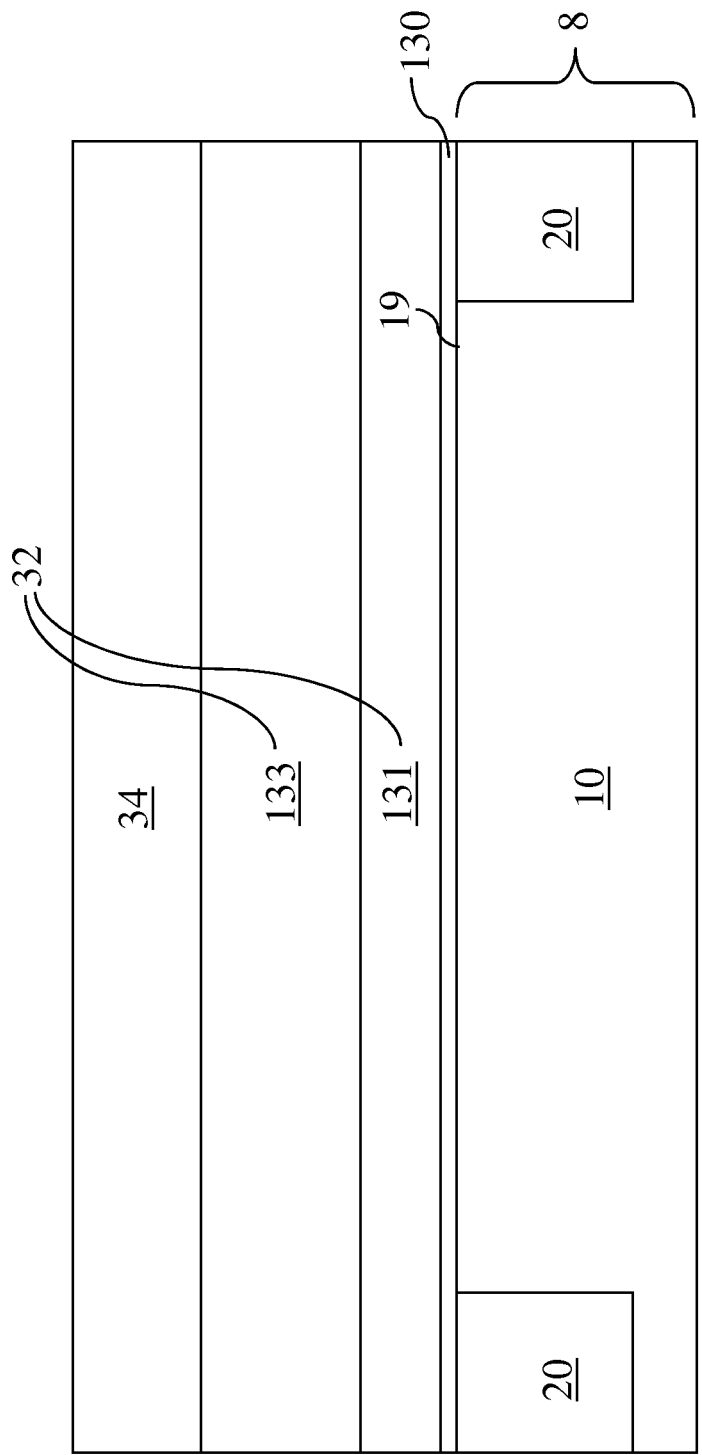
FIGS. 15-24 are sequential vertical cross-sectional views of a second exemplary structure according to a second embodiment of the present invention.

Referring to FIG. 15, a second exemplary semiconductor structure according to a second embodiment of the present invention comprises a semiconductor substrate 8 containing shallow trench isolation 20 and a substrate layer 10 as in the first embodiment.

A gate dielectric 130 is formed on the top surface 19 of the semiconductor substrate 8. The gate dielectric 130 may be a silicon oxide based dielectric material comprising silicon oxide, nitridated silicon oxide, silicon oxynitride, or a stack thereof. The conventional silicon oxide based dielectric material may be formed by thermal conversion of a top portion of the substrate layer 10 and/or by chemical vapor deposition (CVD).

Alternately and preferably, the gate dielectric 130 comprises a high-k dielectric material such as $HfO_2$, $ZrO_2$, $La_2O_3$, $TiO_2$, $SrTiO_3$, $Y_2O_3$, $Al_2O_3$, $LaAlO_3$, an alloy thereof, and a silicate thereof. Methods of forming a high-k dielectric material described above may be employed.

A first gate conductor layer 32 is formed on the gate dielectric 130. The first gate conductor layer 32 may comprise a semiconductor layer, a metal layer, or a stack thereof. For example, the first gate conductor layer 32 may comprise a metal gate layer 131 and a semiconductor gate layer 133. The metal gate layer 131 may comprise a metal such as Ti, TaN, TaSiN, $CoSi_2$, Ni, WN, W, Re, and NiSi. The semiconductor gate layer 131 may comprise a doped semiconductor material such as p-doped polysilicon, n-doped polysilicon, p-doped polycrystalline silicon alloy, or n-doped polycrystalline silicon alloy.

In one embodiment, the substrate layer 10 comprises silicon and the metal gate layer 131 comprises a material having a work function closer to the valence band of silicon than to the conduction band of silicon such as n-doped polysilicon, Ti, TaN, TaSiN, and $CoSi_2$. In another embodiment, the substrate layer 10 comprises silicon and the metal gate layer comprises a material having a work function closer to the conduction band of silicon than to the valence band of silicon such as WN, W, Re, and NiSi.

Alternately, the first gate conductor layer 32 may consist of a semiconductor layer comprising a doped semiconductor material such as p-doped polysilicon, n-doped polysilicon, p-doped polycrystalline silicon alloy, or n-doped polycrystalline silicon alloy, or may consist of a metal layer comprising a metal such as Ti, TaN, TaSiN, $CoSi_2$, Ni, WN, W, Re, and NiSi.

A spacer template layer 34 is formed on the first gate conductor layer 32 as in the first embodiment. The physical and compositional properties of the spacer template layer 34 are the same as in the first embodiment.

Figure 16:
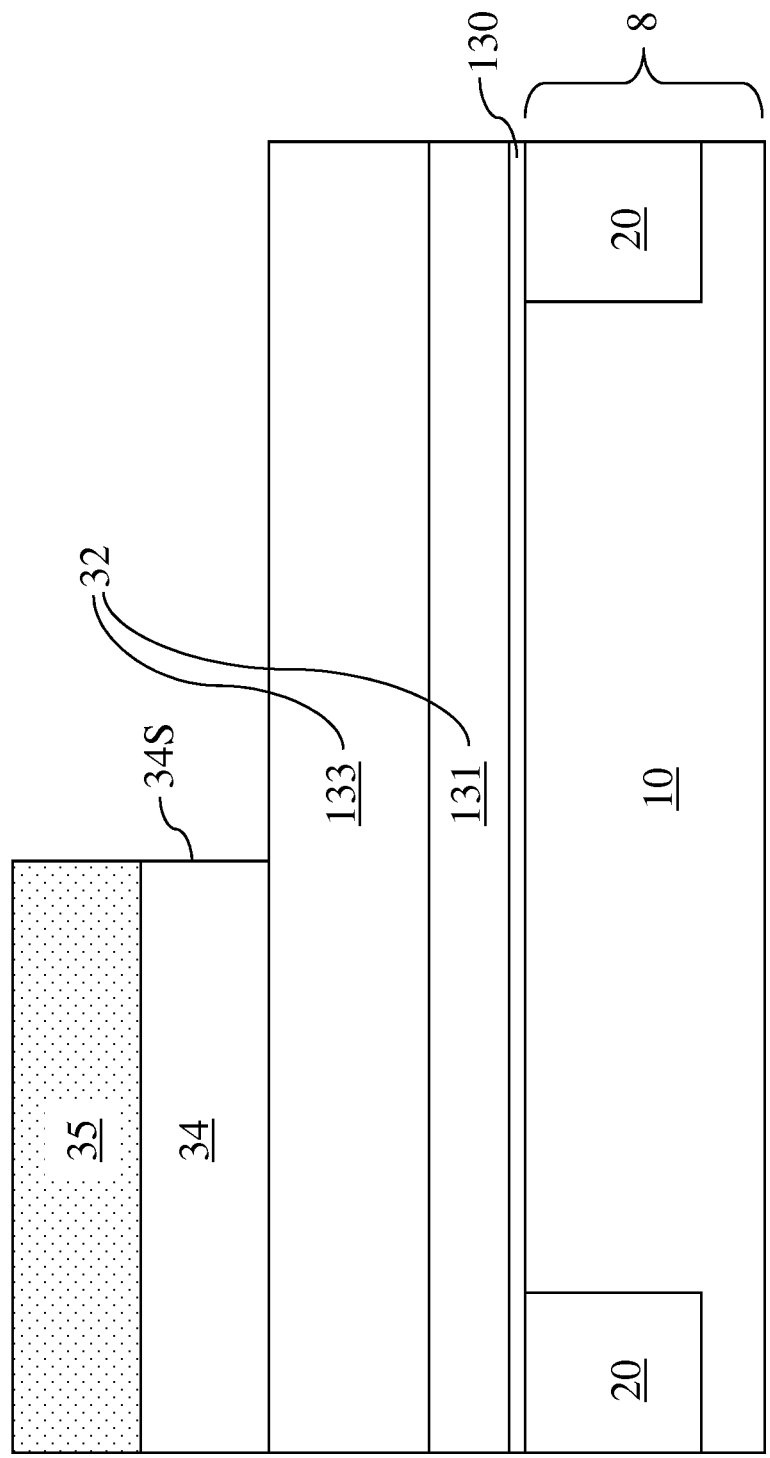

Referring to FIG. 16, a photoresist 35 is applied to a top surface of the spacer template layer 34 and lithographically patterned. The pattern in the photoresist 35 is transferred into the spacer template layer 34 by a reactive ion etch and forms a sidewall 34S that is substantially vertical and extends from a top surface of the spacer template layer 34 to a bottom surface of the spacer template layer 34 as in the first embodiment.

Figure 17:
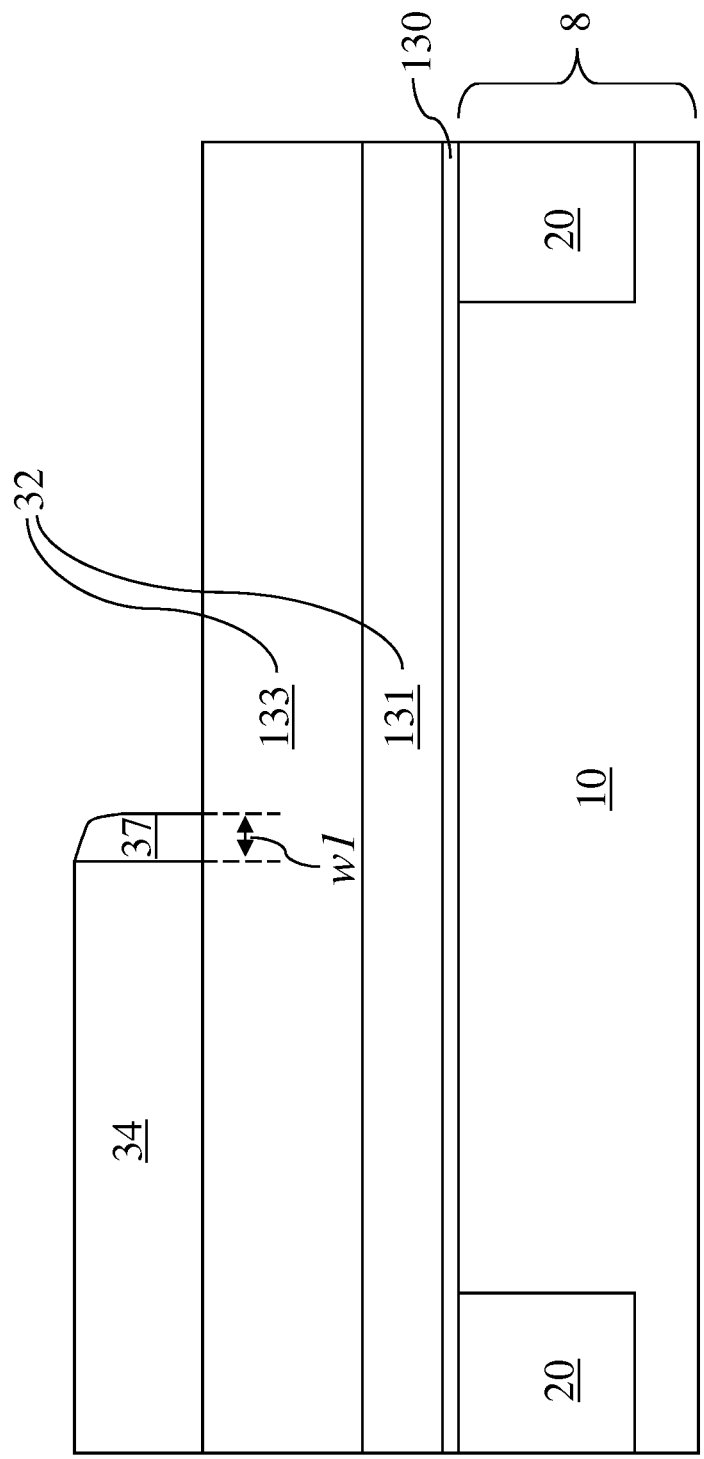

Referring to FIG. 17, a first dielectric spacer 37 is formed by conformal deposition of a first dielectric layer (not shown) and an anisotropic reactive ion etch as in the first embodiment. The physical and compositional properties of the first dielectric spacer 37 are the same as in the first embodiment.

The definition and properties of the width w1 of the first dielectric spacer 37 is the same as in the first exemplary structure in FIG. 3.

Exposed portions of the first gate conductor layer is removed by a reactive ion etch that employs the first dielectric spacer 37 as an etch mask. In one embodiment, the spacer template layer 34 may also be employed as the etch mask, i.e., the dielectric layer 37 and the spacer template layer are collectively employed as the etch mask. In another embodiment, at least a portion of the spacer template layer 34 may be removed by the reactive ion etch. Different levels of removal of the spacer template layer 34 including a complete removal are contemplated herein.

The reactive ion etch stops on the first gate dielectric 30, and an insignificant amount, if any, of the first gate dielectric 30 is removed by the reactive ion etch.

Figure 18:
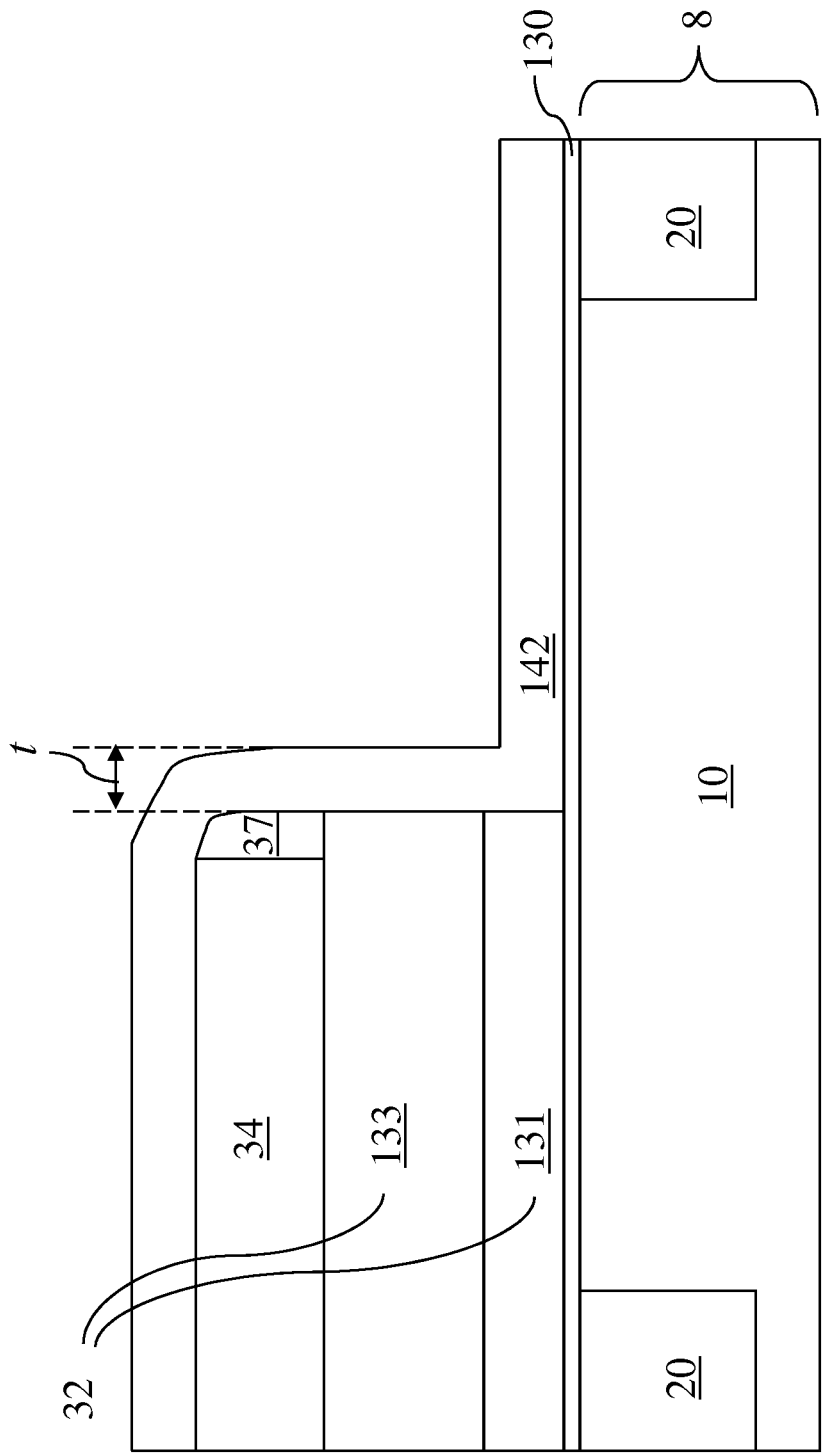

Referring to FIG. 18, a second gate conductor layer 142 is deposited on a sidewall of the first gate conductor layer 32 and on the first dielectric spacer 37. The second gate conductor layer 172 is preferably conformal, i.e., has substantially the same thickness on a sidewall as on a horizontal surface.

The second gate conductor layer 142 may comprise a semiconductor material such as doped polysilicon or doped silicon containing alloy, or may comprise a metal such as Ti, TaN, TaSiN, $CoSi_2$, Ni, WN, W, Re, and NiSi. Preferably, the second gate conductor layer 142 comprises a different material from the first gate conductor layer 32.

In one embodiment, the substrate layer 10 comprises silicon and the metal gate layer 131 comprises a material having a work function closer to the valence band of silicon than to the conduction band of silicon such as n-doped polysilicon, Ti, TaN, TaSiN, and $CoSi_2$, while the second gate conductor layer 142 comprises a material having a work function closer to the conduction band of silicon than to the valence band of silicon such as p-doped polysilicon, WN, W, Re, and NiSi. In this case, the field effect transistor to be formed is preferably an n-type transistor having a p-type body and n-type source and drain regions.

In another embodiment, the substrate layer 10 comprises silicon and the metal gate layer 131 comprises a material having a work function closer to the conduction band of silicon than to the valence band of silicon such as p-doped polysilicon, WN, W, Re, and NiSi, while the second gate conductor layer 142 comprises a material having a work function closer to the valence band of silicon than to the conduction band of silicon such as n-doped polysilicon, Ti, TaN, TaSiN, and $CoSi_2$. In this case, the field effect transistor to be formed is preferably a p-type transistor having an n-type body and p-type source and drain regions.

The thickness t of the second gate conductor layer 142, or the lateral width of the portion of the second gate conductor layer 142 on the sidewall of the first gate conductor layer 32, substantially determines the width of a second gate conductor to be subsequently formed. The thickness t of the second gate conductor layer 142 may be from about 5 nm to about 50 nm, although lesser and greater dimensions are also contemplated herein.

Figure 19:
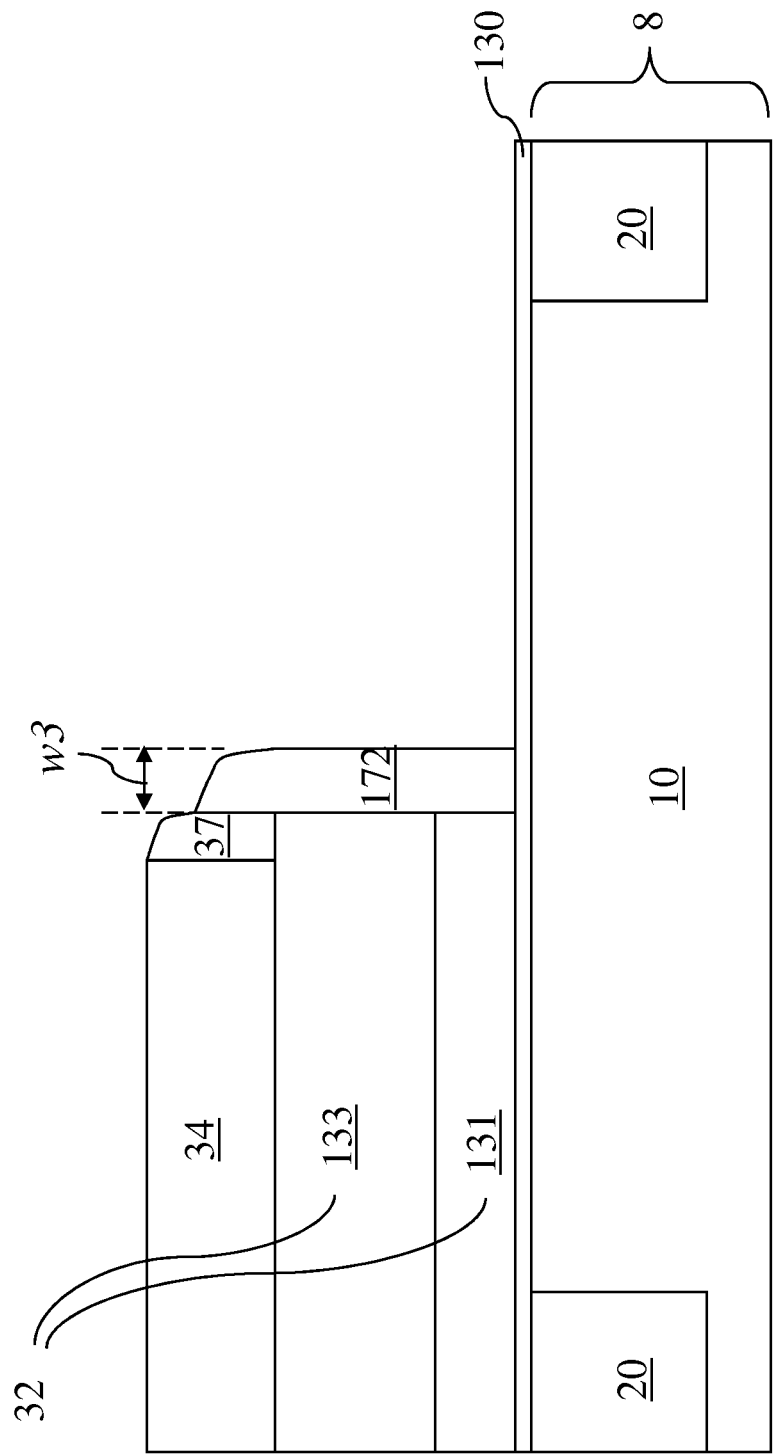

Referring to FIG. 19, an anisotropic reactive ion etch is performed on the second gate conductor layer 142 to remove horizontal portions. Not necessarily but preferably, the anisotropic reactive ion etch is selective to at least one of the first dielectric spacer 37, the spacer template layer 34, and the first gate dielectric 130. The remaining portion of the second gate conductor layer 142 on the sidewall of the first gate conductor layer 32 constitutes a second gate conductor 172.

The second gate conductor 172 has a width w3, which is herein referred to as a third width w3. The third width w3 is substantially determined by the thickness t of the second gate conductor layer 142, and may be the same. The third width w3 of the second gate conductor 172 is less than the gate length of the gate electrode to be subsequently formed. As will be shown below, the sum of the first width w1 and the third width w3 is substantially the same as the gate length of the gate electrode to be subsequently formed. The third width w3 may be from about 5 nm to about 50 nm, although lesser and greater dimensions are also contemplated herein.

Figure 20:
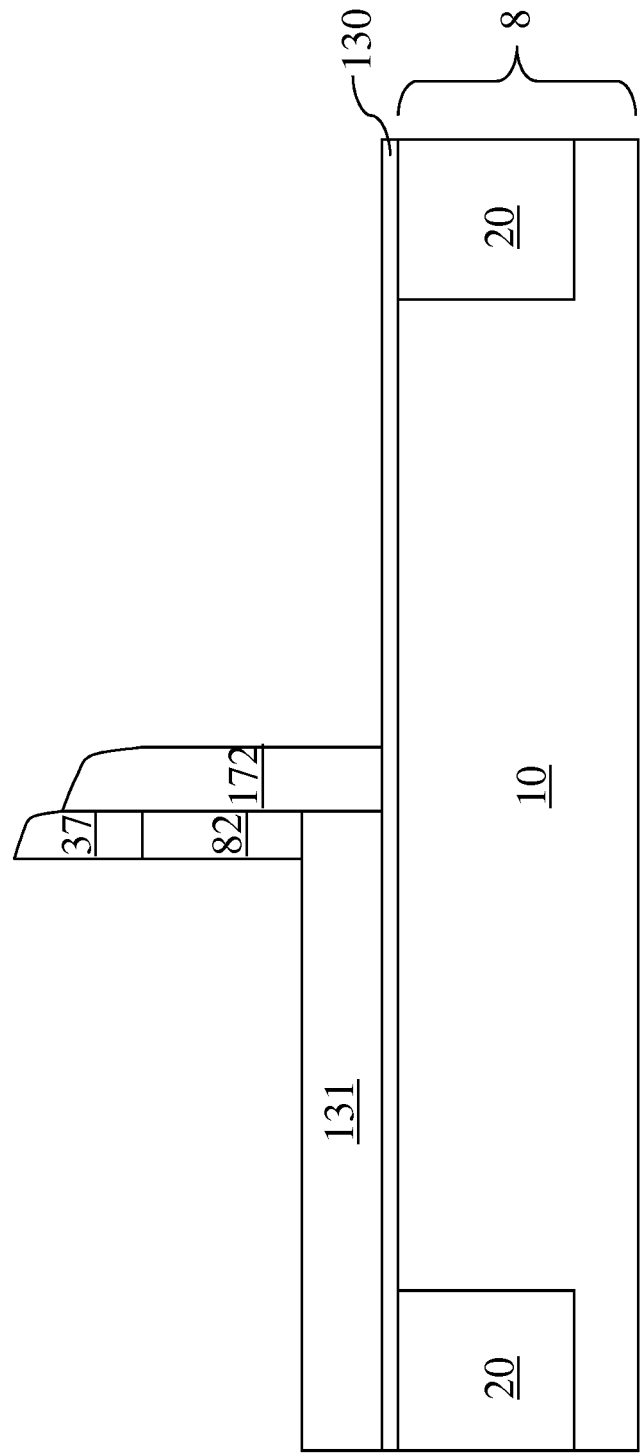

Referring to FIG. 20, any remaining portion of the spacer template layer 34 is removed by a wet etch or a reactive ion etch. Employing the first dielectric spacer 37 and the second gate conductor 172 collectively as an etch mask, exposed portions of the semiconductor gate layer 133 are etched at least down to a top surface of the metal gate layer 131. The remaining portion of the semiconductor gate layer 133 constitutes a semiconductor gate 82. Some or all of the exposed portion of the gate dielectric 130 may be removed during the etch.

Figure 21:
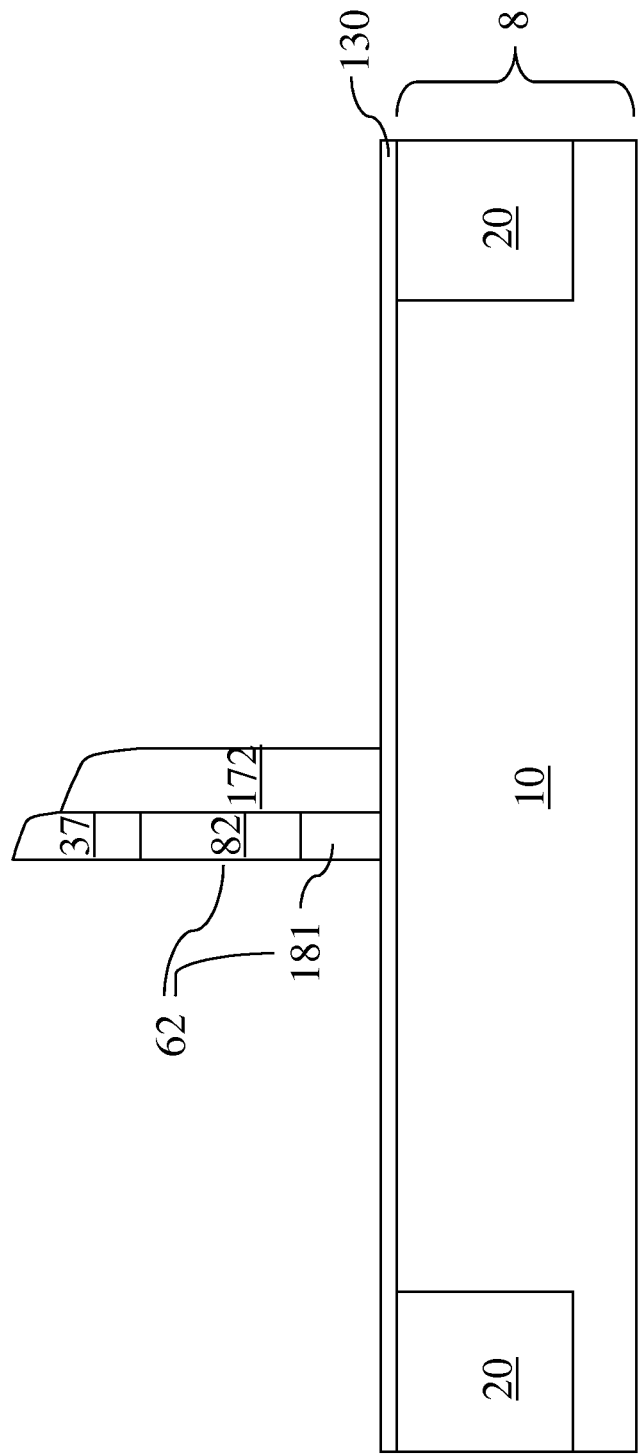

Referring to FIG. 21, the etch further proceeds to remove exposed portions of the metal gate layer 131 employing the first dielectric spacer 37 and the second gate conductor 172 collectively as an etch mask. The remaining portion of the metal gate layer 131 constitutes a metal gate 181. The metal gate 181 and the semiconductor gate 82 collectively constitute a first gate conductor 62.

Figure 22:
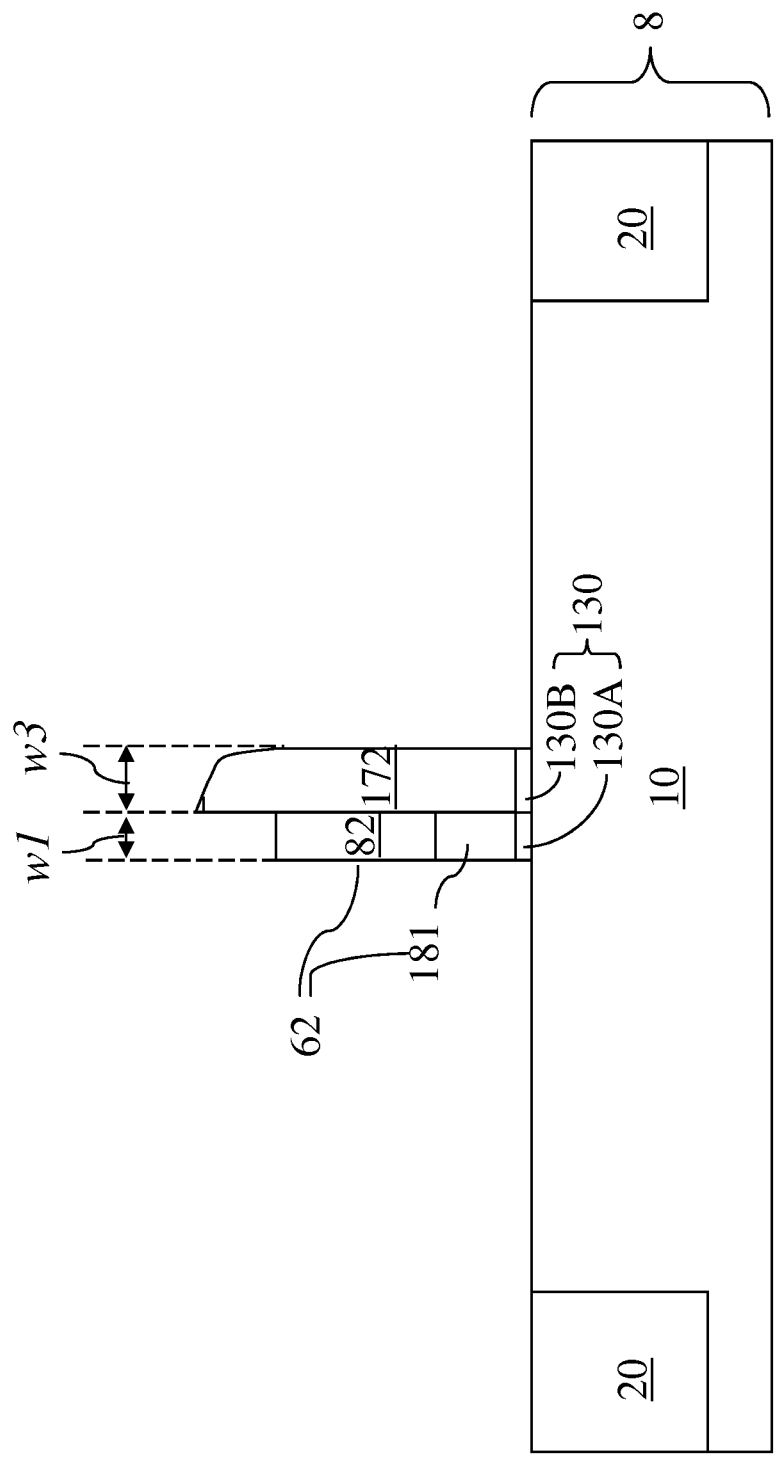

Referring to FIG. 22, the first dielectric spacer is removed, for example, by a wet etch or a reactive ion etch. Preferably, the removal of the first dielectric spacer 37 is selective to the shallow trench isolation 20, i.e., the removed amount of the shallow trench isolation 20 is insignificant.

The gate dielectric 130 is shown in two portions, i.e., a first gate dielectric portion 130A located directly beneath the first gate conductor 62 and a second gate dielectric portion 130B located directly beneath the second gate conductor 172. The first gate conductor 62 and the second gate dielectric portion 130B are of integral construction and collectively constitute the gate dielectric 130. The first gate conductor 62 and the second gate dielectric portion 130B have the same composition and the same thickness. The first gate conductor 62 electrically couples to the substrate layer 10 primarily by a capacitive coupling and band gap manipulation through the first gate dielectric portion 130A. Likewise, the second gate conductor 172 electrically couples to the substrate layer 10 primarily by a capacitive coupling and band gap manipulation through the second gate dielectric portion 130B. Different work functions of the materials in the first gate conductor 62 and the second gate conductor may be advantageously utilized to improve performance of a MOSFET.

The sum of the first width w1 and the third width w3 is substantially the same as the gate length of the gate electrode, which comprises the first gate conductor 62 and the second gate conductor 172.

Figure 23:
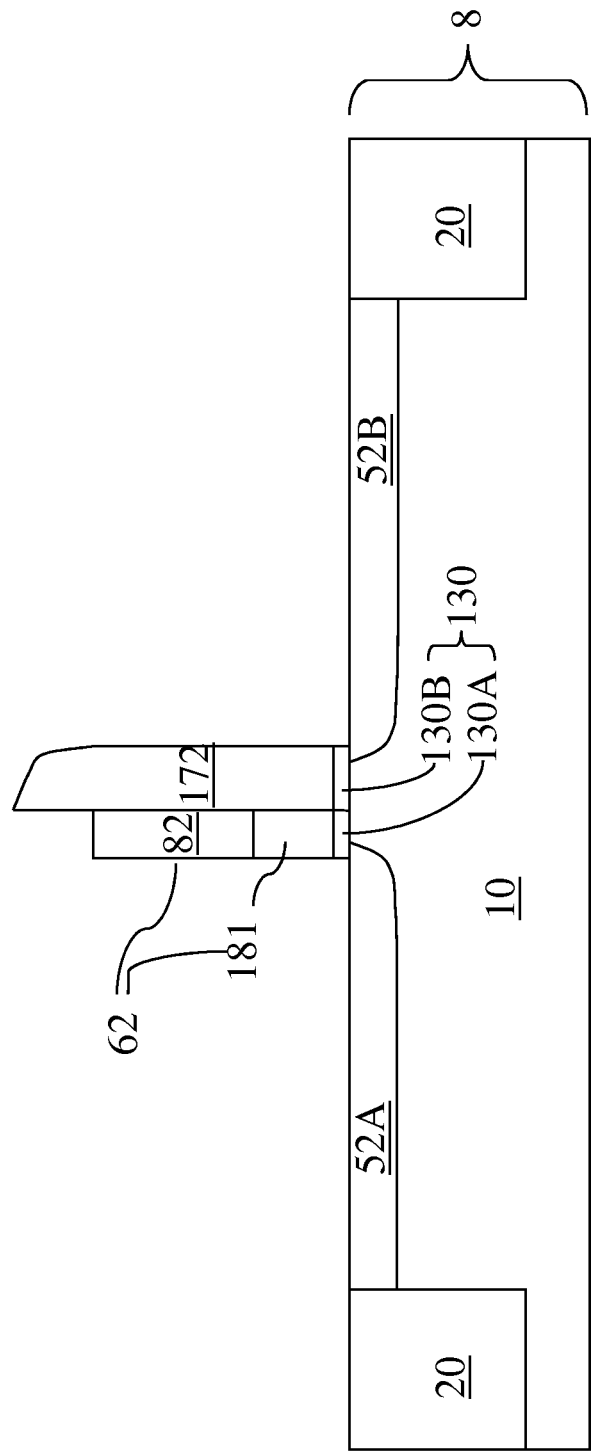

Referring to FIG. 23, source extension region 52A and drain extension region 52B having a doping of a second conductivity type may be formed by implantation of dopants of the second conductivity type, as in the first exemplary semiconductor structure in FIG. 10. Halo implantation may be performed to form source side halo region (not shown) and drain side halo region (not shown) directly beneath the source extension region 52A and the drain extension region 52B, respectively as in the first exemplary semiconductor structure.

Figure 24:
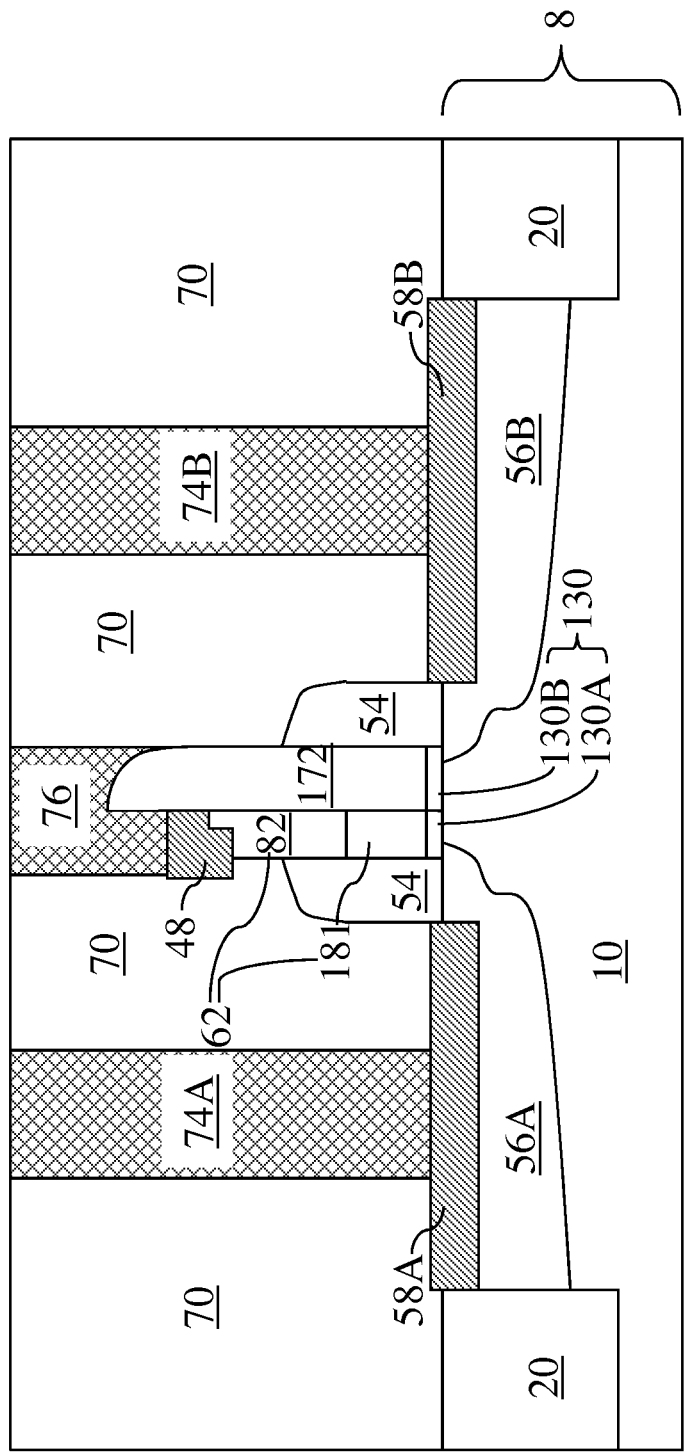

Referring to FIG. 24, the same processing steps are subsequently employed on the second exemplary semiconductor structure as on the first exemplary semiconductor structure as described above.

The second exemplary semiconductor structure comprises:
a source side gate electrode containing a first gate dielectric portion 130A and a first gate conductor 62, wherein the first gate dielectric portion 130A vertically abuts the body and comprises a high-k dielectric material, and wherein the first gate conductor 62 abuts the first gate dielectric; and
a drain side gate electrode abutting the source side gate electrode (130A, 62) and containing a second gate dielectric portion 130B and a second gate conductor 172, wherein the second gate dielectric portion 130B vertically abuts the body and comprises the high-k dielectric material and has a same thickness as the first gate dielectric portion 130A.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a body comprising a semiconductor material, the body having a doping of a first conductivity type, and the body located in a semiconductor substrate;
   a source region having a doping of a second conductivity type, the source region contacting said body, and the source region located in said semiconductor substrate, wherein said second conductivity type is an opposite of said first conductivity type;
   a drain region having a doping of said second conductivity type, the drain region contacting said body, wherein the drain region is disjoined from said source region, and the drain region is located in said semiconductor substrate;
   a source side gate electrode containing a first gate dielectric and a first gate conductor, wherein said first gate dielectric vertically abuts said body, and wherein said first gate conductor abuts said first gate dielectric;
   a drain side gate electrode contacting said source side gate electrode and containing a second gate dielectric and a second gate conductor, wherein said second gate dielectric vertically abuts said body, and wherein said second gate conductor abuts said second gate dielectric; and
   a single metal semiconductor alloy structure that contacts both of the source side gate electrode and the drain side gate electrode, wherein a top portion of said second gate dielectric is embedded within a portion of the single metal semiconductor alloy structure.

2. The semiconductor structure of claim 1, wherein said first gate dielectric comprises a silicon oxide based dielectric material and said second gate dielectric comprises a high-k dielectric material.

3. The semiconductor structure of claim 1, wherein said second gate dielectric is L-shaped, and wherein said first gate conductor is laterally spaced from said second gate conductor by said second gate dielectric.

4. The semiconductor structure of claim 3, wherein said second gate dielectric vertically extends from a top surface of said semiconductor substrate at least to a top surface of said drain side gate electrode.

5. The semiconductor structure of claim 4, wherein said second gate dielectric vertically does not extend above said top surface of said drain side gate electrode.

6. The semiconductor structure of claim 4, wherein said second gate dielectric vertically extends above a top surface of said drain side gate electrode.

7. The semiconductor structure of claim 1, wherein said first gate conductor comprises a first semiconductor material and said second gate conductor comprises a second semiconductor material, wherein said second semiconductor material is different from said first semiconductor material.

8. The semiconductor structure of claim 1, further comprising a gate metal semiconductor alloy contiguously extending over an entirety of said source side gate electrode, a vertical portion of said second gate dielectric, and said drain side gate electrode.

9. The semiconductor structure of claim 1, wherein said semiconductor material comprises silicon, and wherein said first gate dielectric comprises silicon oxide or nitridated silicon oxide, and wherein said second gate dielectric is one of $HfO_2$, $ZrO_2$, $La_2O_3$, $TiO_2$, $SrTiO_3$, $Y_2O_3$, $Al_2O_3$, $LaAlO_3$, and a combination thereof, and each of said first gate conductor and said second semiconductor comprises at least one of doped polysilicon, Ti, TaN, TaSiN, $CoSi_2$, Ni, WN, W, Re, and NiSi.

10. The semiconductor structure of claim 1, further comprising a gate spacer comprising a dielectric material, wherein the gate spacer is laterally contacting said first gate conductor and said second gate conductor, wherein the gate spacer is vertically contacting a planar surface of said first gate dielectric and the gate spacer is contacting a planar surface of said second gate dielectric.

11. The semiconductor structure of claim 10, further comprising:
   a source metal semiconductor alloy laterally contacting said first gate dielectric; and
   a drain metal semiconductor alloy laterally contacting said second gate dielectric.

12. The semiconductor structure of claim 10, wherein a first periphery of a bottom surface said gate spacer coincides with a periphery of said planar surface of said first gate dielectric, and a second periphery of said bottom surface said gate spacer coincides with a periphery of said planar surface of said second gate dielectric.

* * * * *